United States Patent
Liu et al.

(10) Patent No.: US 12,038,638 B2
(45) Date of Patent: Jul. 16, 2024

(54) DISPLAY DEVICE

(71) Applicants: K-TRONICS (SUZHOU) TECHNOLOGY CO., LTD., Jiangsu (CN); BOE TECHNOLOGY GROUP CO., LTD., Beijing (CN)

(72) Inventors: Hao Liu, Beijing (CN); Yunben Shen, Beijing (CN); Guangning Hao, Beijing (CN); Tao Ni, Beijing (CN); Yang Liu, Beijing (CN); Lihua Sheng, Beijing (CN)

(73) Assignees: K-TRONICS (SUZHOU) TECHNOLOGY CO., LTD., Jiangsu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/498,135

(22) Filed: Oct. 31, 2023

(65) Prior Publication Data

US 2024/0077760 A1    Mar. 7, 2024

Related U.S. Application Data

(63) Continuation of application No. 17/312,151, filed as application No. PCT/CN2020/125464 on Oct. 30, 2020, now Pat. No. 11,846,840.

(30) Foreign Application Priority Data

Oct. 31, 2019   (WO) ................ PCT/CN2019/114798
Nov. 25, 2019   (CN) .......................... 201922054936.3

(51) Int. Cl.
  *G02F 1/1333*    (2006.01)
  *G02F 1/13357*   (2006.01)
  *H05K 5/02*      (2006.01)

(52) U.S. Cl.
  CPC .. *G02F 1/133328* (2021.01); *G02F 1/133317* (2021.01); *G02F 1/133322* (2021.01); *G02F 1/133608* (2013.01); *H05K 5/0204* (2013.01)

(58) Field of Classification Search
  CPC ..................... G02F 1/133608; G02F 1/133317
  See application file for complete search history.

(56) References Cited

U.S. PATENT DOCUMENTS 5,729,310 A    3/1998   Horiuchi
7,572,047 B2 * 8/2009  Kim .................. G02F 1/133604
                                                   362/225

(Continued)

FOREIGN PATENT DOCUMENTS

CN    202256943 U    5/2012
CN    202658819 U    1/2013

(Continued)

OTHER PUBLICATIONS

Office action from Chinese Application No. 201922054936.3 dated May 28, 2020.

(Continued)

*Primary Examiner* — Eric T Eide
(74) *Attorney, Agent, or Firm* — Calfee, Halter & Griswold LLP

(57) ABSTRACT

A display device includes: a frame, including a frame body, a first protrusion disposed on the frame body, and a second protrusion disposed on the frame body, the second protrusion including at least one stepped portion; a display panel, located on a side of one stepped portion of the at least one stepped portion close to a light emitting surface of the display device and located on an inner side of the frame body; and a planar back housing, fixed on the inner side of the frame body and a side of the first protrusion away from the light emitting surface.

20 Claims, 13 Drawing Sheets

(56) References Cited

U.S. PATENT DOCUMENTS

| | | | |
|---|---|---|---|
| 7,573,540 B2 | 8/2009 | Katsuda | |
| 10,331,171 B2 | 6/2019 | Seino | |
| 2005/0083711 A1 | 4/2005 | Wu et al. | |
| 2010/0171897 A1* | 7/2010 | Yun | G02F 1/133605 |
| | | | 349/58 |
| 2014/0333844 A1* | 11/2014 | Ito | G02F 1/133308 |
| | | | 348/794 |
| 2016/0282549 A1 | 9/2016 | Masuda | |
| 2016/0377908 A1* | 12/2016 | Shin | G02F 1/133308 |
| | | | 349/58 |
| 2017/0083273 A1* | 3/2017 | Kim | G02F 1/133317 |
| 2019/0121020 A1* | 4/2019 | Jeon | G02B 6/0055 |
| 2020/0209687 A1* | 7/2020 | Yan | G02F 1/133308 |

FOREIGN PATENT DOCUMENTS

| | | |
|---|---|---|
| CN | 203868843 U | 10/2014 |
| CN | 106200124 A | 12/2016 |
| CN | 107490888 A | 12/2017 |
| CN | 107896439 A | 4/2018 |
| CN | 207369182 U | 5/2018 |
| CN | 108153019 A | 6/2018 |
| CN | 209196507 U | 8/2019 |
| CN | 209343668 U | 9/2019 |
| CN | 211152418 U | 7/2020 |
| JP | 11-202787 A | 7/1999 |

OTHER PUBLICATIONS

International Search Report and Written Opinion from PCT/CN2019/114798 dated Aug. 11, 2020.
International Search Report and Written Opinion from PCT/CN2020/125464 dated Jan. 21, 2021.
Office action from Chinese Application No. 201980002237.4 dated Jun. 1, 2022.

* cited by examiner

DISPLAY DEVICE

CROSS REFERENCE TO RELATED APPLICATIONS

The present application is a continuation of U.S. patent application Ser. No. 17/312,151, filed on Jun. 9, 2021, which is the national stage entry of PCT/CN2020/125464, filed on Oct. 30, 2020, which claims the priority of Chinese Patent Application No. 201922054936.3 filed on Nov. 25, 2019 and International Patent Application No. PCT/CN2019/114798 filed on Oct. 31, 2019, the entire disclosures of which are incorporated herein by reference.

TECHNICAL FIELD

The present disclosure relates to the field of display technologies, especially to a display device.

BACKGROUND

Some display devices, such as televisions, computers, mobile phones and other devices with display functions, typically include a device housing as well as a display module, a backlight module and other components arranged inside the housing. Generally speaking, both the display module and the backlight module are provided with a back housing to support other components in the modules.

SUMMARY

The present disclosure provides a display device comprising: a frame comprising: a frame body, a first protrusion disposed on the frame body, and a second protrusion disposed on the frame body, the second protrusion comprising at least one stepped portion; a display panel located on a side of one stepped portion of the at least one stepped portion close to a light emitting surface of the display device and located on an inner side of the frame body; and a planar back housing fixed on the inner side of the frame body and a side of the first protrusion away from the light emitting surface.

In some embodiments, the first protrusion is located at an end of the frame body away from the light emitting surface, the second protrusion is located at an end of the frame body close to the light emitting surface, and the planar back housing is adhered to a surface of the first protrusion away from the light emitting surface.

In some embodiments, the display device further comprises: a circuit board comprising a display driving circuit board and a main board, the main board comprising a system-on-chip and a timing controller which are integrated, and the display driving circuit board and the main board being connected by a flexible circuit.

In some embodiments, the display device further comprises an optical structure layer located on a side of the display panel away from is the light emitting surface; the frame body comprises a front frame that surrounds an edge of the display panel; and a middle frame that is disposed within a space formed by the display panel, the front frame and the planar back housing, the middle frame, the front frame and the planar back housing forming an inner cavity in which the circuit board is disposed.

In some embodiments, the first protrusion extends from an inner wall of the front frame; and the second protrusion extends from an inner wall of the middle frame.

In some embodiments, the middle frame comprises: a first side middle frame, a second side middle frame, a third side middle frame, and a fourth side middle frame; the first side middle frame and the fourth side middle frame being arranged opposite to each other, and the second side middle frame and the third side middle frame being arranged opposite to each other; the front frame comprises: a first side front frame, a second side front frame, a third side front frame, and a fourth side front frame; the first side front frame and the fourth side front frame being arranged opposite to each other, the second side front frame and the third side front frame being arranged opposite to each other, and the first side front frame, the second side front frame, the third side front frame and the fourth side front frame forming a rectangular closed structure around the display panel; the fourth side middle frame comprises a side wall plate inclined from an inner side of the planar back housing to the edge of the display panel, and the side wall plate, the fourth side front frame and the planar back housing forming a first inner cavity in which the circuit board is disposed.

In some embodiments, the display device further comprises: an inner frame disposed between the fourth side middle frame and the fourth side front frame, the inner frame comprising a first inner frame wall and a second inner frame wall that are perpendicular to each other, the first inner frame wall being used to support the display panel, and is the second inner frame wall being connected to the fourth side middle frame to limit a position of the optical structure layer of the display device.

In some embodiments, the display device further comprises: a light bar assembly disposed on a side of the planar back housing facing the display panel and in contact with the planar back housing, the light bar assembly comprising a plurality of light sources; and a reflective sheet disposed on a side of the light bar assembly facing the display panel, comprising: a first reflective portion that is parallel to a surface of the planar back housing facing the display panel; a second reflective portion that forms an angle with respect to the surface of the planar back housing facing the display panel, wherein the first reflective portion is provided with a plurality of openings, and each light source on the light bar assembly penetrates one of the plurality of openings; wherein the optical structure layer, the second reflective portion of the reflective sheet, and the middle frame are fixedly connected by a fastening element.

In some embodiments, the reflective sheet, the fourth side front frame and the planar back housing form the first inner cavity; the first side middle frame, the planar back housing and the reflective sheet form a second inner cavity; the second side middle frame, the planar back housing and the reflective sheet form a third inner cavity; the third side middle frame, the planar back housing and the reflective sheet form a fourth inner cavity; each of the first side front frame, the second side front frame and the third side front frame comprises an engaging portion, the first side middle frame is provided with a guide rail on a side close to the first side front frame, and the engaging portion of the first side front frame is fixedly connected to the first side middle frame through the guide rail of the first side middle frame; the second side middle frame is provided with a guide rail on a side close to the second side front frame, and the engaging portion of the second is side front frame is fixedly connected to the second side middle frame through the guide rail of the second side middle frame; the third side middle frame is provided with a guide rail on a side close to the third side front frame, and the engaging portion of the third side front frame is fixedly connected to the third side middle frame through the guide rail of the third side middle frame.

In some embodiments, each of the first side middle frame, the second side middle frame, and the third side middle frame comprises: a first middle frame wall comprising a guide rail side wall, a position limiting side wall, and a supporting side wall, the guide rail being arranged on the guide rail side wall, the position limiting side wall being used to limit a position of the optical structure layer and the display panel of the display device, and the supporting side wall being used to support the display panel; a second middle frame wall that is configured to support the optical structure layer of the display device; a third middle frame wall that is parallel to the surface of the planar back housing facing the display panel, at least a portion of the third middle frame wall being in contact with the planar back housing.

In some embodiments, the display device further comprises: a first circuit board fixing member, the display driving circuit board being fixed on a side of the side wall plate of the fourth side middle frame close to the first inner cavity by the first circuit board fixing member, wherein the first circuit board fixing member comprises a first mounting portion and a first engaging portion, the first mounting portion is fixed on the side of the side wall plate of the fourth side middle frame close to the first inner cavity, and the first engaging portion is used to fix the display driving circuit board.

In some embodiments, the display device further comprises: a second circuit board fixing member, the main board being fixed on a side of the planar back housing close to the display panel by the second circuit board fixing member, wherein the second circuit board fixing is member comprises a second mounting portion and a second engaging portion, the second mounting portion is fixed on the side of the planar back housing close to the display panel, and the second engaging portion is used to fix the main board.

In some embodiments, the display device further comprises: a functional component, the functional component comprising one or more of: a voice component, a network component, a Bluetooth component, and an infrared photosensitive component, the functional component being disposed in the first inner cavity.

In some embodiments, the second protrusion comprises a first stepped portion and a second stepped portion, the first stepped portion is closer to the frame body than the second stepped portion in a direction perpendicular to the frame body, and a stepped surface of the first stepped portion parallel to the light emitting surface is closer to the light emitting surface than a stepped surface of the second stepped portion parallel to the light emitting surface.

In some embodiments, the display panel is located on a side of the first stepped portion close to the light emitting surface and located on the inner side of the frame body.

In some embodiments, the display device further comprises: an optical structure layer located on a side of the second stepped portion close to the light emitting surface and located on an inner side of the first stepped portion.

In some embodiments, the first stepped portion is provided with a first engaging slot on a side close to the light emitting surface, and the second stepped portion is provided with a second engaging slot on the side close to the light emitting surface; the display device further comprises a positioning elastic sheet, the positioning elastic sheet comprising a first engaging plate portion, a second engaging plate portion, and a connecting plate portion, the first engaging plate portion being engaged with the first engaging slot, the second engaging plate is portion being engaged with the second engaging slot, and the second engaging plate portion having a strip-shaped socket extending parallel to the light emitting surface; an edge of the optical structure layer is provided with a convex lug, and the convex lug is inserted into the strip-shaped socket.

In some embodiments, the stepped surface of the first stepped portion parallel to the light emitting surface has a sink groove for accommodating the connecting plate portion, and the sink groove has a depth not smaller than a thickness of the connecting plate portion.

In some embodiments, the frame body comprises a first side frame body, a second side frame body, a third side frame body, and a fourth side frame body; the first side frame body and the fourth side frame body being disposed opposite to each other, the second side frame body and the third side frame body being disposed opposite to each other, the first side frame body, the second side frame body, the third side frame body and the fourth side frame body forming a rectangular closed structure, and the first protrusion and the second protrusion both extending from an inner wall of each of the first side frame body, the second side frame body, the third side frame body, and the fourth side frame body, wherein the fourth side frame body comprises a ground side support frame portion parallel to the light emitting surface, on which the circuit board is disposed.

In some embodiments, the display device further comprises: a pair of base mounting brackets fixed at left and right ends of the fourth side frame body respectively, the pair of base mounting brackets having mounting sockets with openings facing the ground.

In some embodiments, the display device further comprises a wall-hung support member embedded in an inner surface of an edge of the planar back housing, the wall-hung support member being provided with a mounting groove for fixed connection to a hook-shaped wall-hung member, the wall-hung member being used for hanging and is fixing the display device.

In some embodiments, the wall-hung member comprises a main body portion, a bearing portion and a position limiting portion, the bearing portion bearing the display device at its lower side, the position limiting portion protruding in a direction perpendicular to the main body portion to limit a relative movement between the wall-hung member and the display device.

In some embodiments, the display device further comprises a wall-hung plate configured to be fixedly connected to a wall, the wall-hung plate being provided with a plurality of hanging holes; and a plurality of hangers located on a side of the planar back housing away from the light emitting surface, the plurality of hangers being hung in the plurality of hanging holes at corresponding positions of the wall-hung plate.

In some embodiments, the hanger is a bolt; the hanging hole comprises a first portion and a second portion associated with each other, the first portion having an aperture larger than a nut diameter of the bolt, the second portion being closer to a side of the display device facing the ground than the first portion, the second portion having an aperture larger than a screw diameter of the bolt and smaller than the nut diameter of the bolt.

In some embodiments, the frame comprises a metal frame, and the planar back housing comprises a tempered glass back panel.

In some embodiments, the second protrusion comprises a first stepped portion and a second stepped portion, the first stepped portion is provided with a first engaging slot on a side close to the light emitting surface, and the second stepped portion is provided with a second engaging slot on the side close to the light emitting surface; the display device further comprises: a positioning elastic sheet, the positioning elastic sheet comprising a first engaging plate portion, a second engaging plate portion, and a connecting plate portion, the first is engaging plate portion being engaged with the first engaging slot, the second engaging plate portion being engaged with the second engaging slot, and the second engaging plate portion having at least one strip-shaped socket extending parallel to the light emitting surface; an optical structure layer, an edge of which is provided with convex lugs that are asymmetrically distributed, each of which is inserted into the corresponding strip-shaped socket.

In some embodiments, the first engaging plate portion is provided with a first hook on a side away from the connecting plate portion; the second engaging plate portion is provided with a second hook on a side away from the connecting plate portion; the first engaging slot is provided with a first hook groove that is cooperated with the first hook; the second engaging slot is provided with a second hook groove that is cooperated with the second hook.

In some embodiments, the circuit board comprises a display driving circuit board and a main board, the main board comprising a system-on-chip and a timing controller which are integrated, and the display driving circuit board and the main board being at least partially overlapped in a direction perpendicular to the light emitting surface.

In some embodiments, the inner frame is a plastic cement inner frame.

In some embodiments, the fourth side front frame and the fourth side middle frame are connected by screws, and the fourth side front frame and the first, second and third side front frames are detachably connected.

In some embodiments, the display device further comprises: an external host, which is integrated with a main board, at least one operation button and at least one interface.

BRIEF DESCRIPTION OF THE DRAWINGS

In order to more clearly illustrate the technical solutions in is embodiments of the present disclosure or related arts, the drawings to be used for description of the embodiments or the related arts will be briefly introduced below. Obviously, the drawings described below are only some embodiments of the present disclosure. A person having an ordinary skill in the art may also obtain other drawings based on these drawings without spending inventive efforts.

DETAILED DESCRIPTION

Figure 1A:
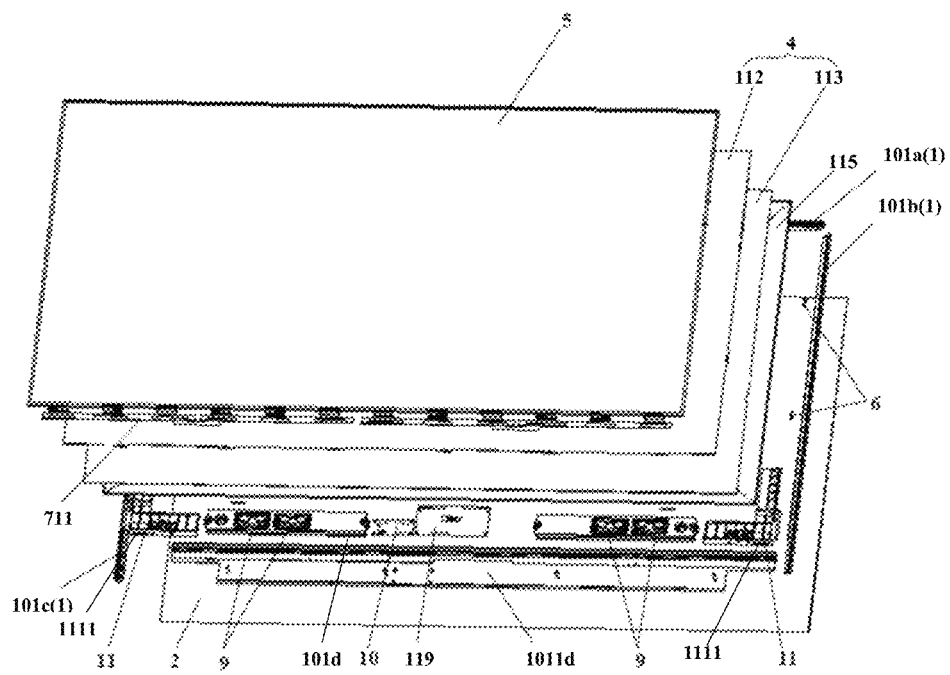
FIG. 1A is an exploded view of a display device according to an embodiment of the present disclosure.

In order to make the objectives, technical solutions and advantages of the present disclosure clearer, the present disclosure will be further described in detail below in conjunction with embodiments and with reference to the accompanying drawings.

It is to be noted that, unless otherwise defined, the technical terms or scientific terms used in the embodiments of the present disclosure should have ordinary meanings understood by a person having an ordinary skill in the field to which the present disclosure pertains. The "first", "second" and similar words used in the present disclosure do not indicate any order, quantity or importance, but are used to distinguish different components. "Include" or "comprise" and similar words mean that an element or component appearing before said word encompasses elements or components listed after said word and their equivalents, but do not exclude other elements or components. "Connected" or "linked" and similar words are not limited to physical or mechanical connections, but may include electrical connections, regardless of direct or indirect. "Upper", "lower", "left", "right" or the like is used to indicate a relative position relationship. When the absolute position of a described object changes, the relative position relationship may also change accordingly.

It is to be noted that the terms "sky side" and "ground side" used in the embodiments of the present disclosure indicate the "upper side" and the "lower side" of a certain device or component respectively. For example, the front frame of a display device comprises a ground side front frame, wherein the ground side front frame refers to the side of the front frame of the display device that is close to the ground when in use, that is, the lower frame. In addition, the term "non-ground side" used in the embodiments of the present disclosure refers to one, two or three sides of the front frame except for the lower frame.

In the present disclosure, when it is described that a specific component is located between the first component and the second component, there may or may not be an intermediate component between said specific component and the first component or the second component. When it is described that a specific component is connected to another component, said specific component may be is directly connected to the other component without an intermediate component, or may not be directly connected to the other component with an intermediate component.

All terms (including technical or scientific terms) used in the present disclosure have the same meanings as understood by those ordinarily skilled in the field to which the present disclosure pertains, unless specifically defined otherwise. It should also be understood that terms such as those defined in general-purpose dictionaries should be interpreted as having meanings consistent with their meanings in the contexts of related arts, and should not be interpreted in idealized or extremely formalized meanings, unless explicitly defined here.

Technologies, methods and apparatuses known to those ordinarily skilled in the relevant fields may not be discussed in detail, but where appropriate, the technologies, methods and apparatuses should be regarded as part of the specification.

Figure 1B:
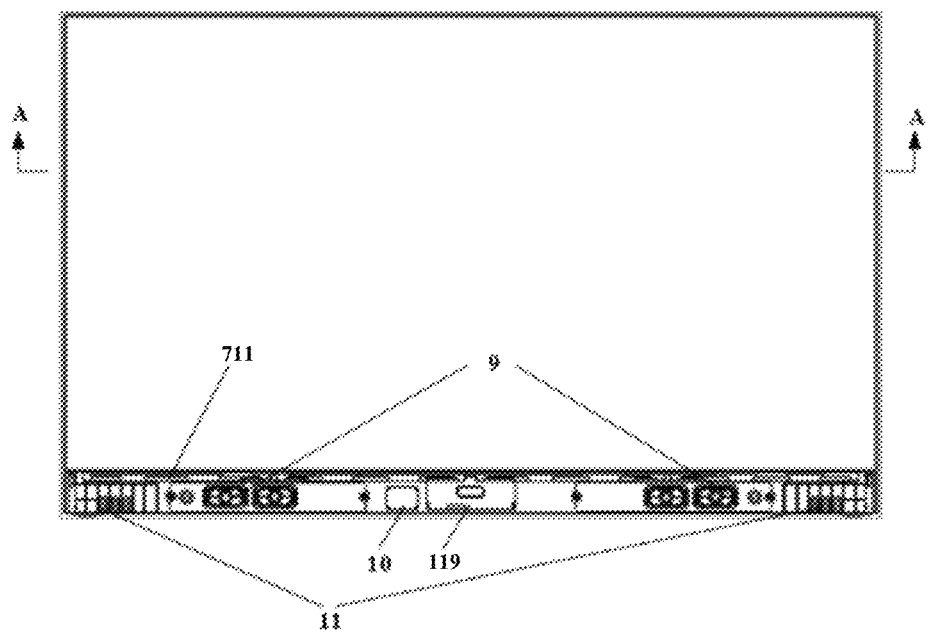
FIG. 1B is a front view of a display device according to an embodiment of the present disclosure, in which the internal structure is shown in perspective from the ground side.
Figure 2A:
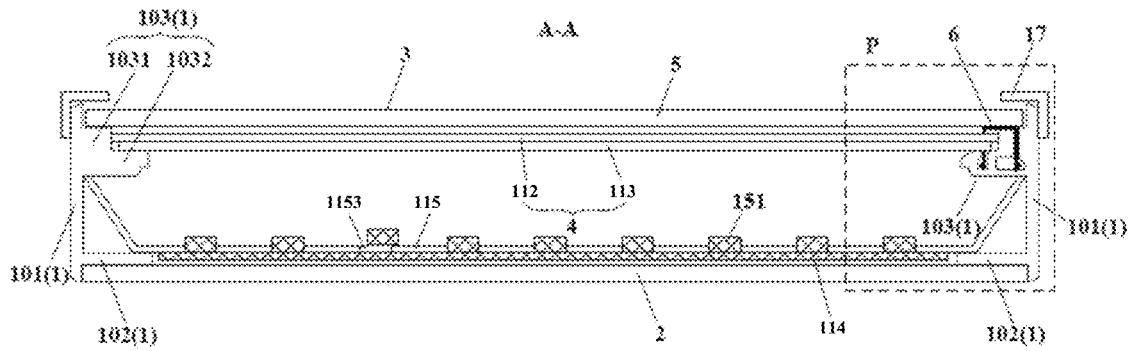
FIG. 2A is a sectional view taken along line A-A in FIG. 1B.

As shown in FIGS. 1A, 1B and 2A, an embodiment of the present disclosure provides a display device, comprising: a frame 1 and a planar back housing 2, wherein the frame 1 comprises: a frame body 101, a first protrusion 102 extending from the inner wall of the frame body 101, and a second protrusion 103 extending from the inner wall of the frame body 101; the first protrusion 102 is located on a side of the frame body 101 away from a light emitting surface 3, the second protrusion 103 is located on a side of the frame body 101 close to the light emitting surface 3, and the second protrusion 103 includes at least one stepped portion; a display panel 5 that is located on a side of one stepped portion of the at least one stepped portion close to the light emitting surface 3 and located on the inner side of the frame body 101; and a planar back housing 2 that is fixed on the inner side of the frame body 101 and a side of the first protrusion 102 away from the light emitting surface 3.

The frame 1 may employ a metal frame, such as an aluminum is profile frame. The planar back housing 2 may employ a tempered glass planar back housing or a stainless steel planar back housing. Referring to FIG. 2A, the planar back housing 2 forms the rear surface of the display device. This design allows the planar back housing to be used not only as a planar back housing of the display module to support other components in the module, but also as an outer housing of the display device, thereby decreasing the overall thickness of the display device and meanwhile reducing and the production cost.

In the embodiment of the present disclosure, the way of fixing the planar back housing to the frame is not limited. For example, the planar back housing may be fixedly connected to the side of the frame away from the light emitting surface by countersunk head screws. In the embodiment shown in FIG. 2A, the first protrusion 102 is in the shape of a plate, and the planar back housing 2 is bonded to a surface of the first protrusion 102 away from the light emitting surface 3. In this way, the number of screw holes on the planar back housing 2 can be reduced, so that the back of the display device is aesthetic.

In an embodiment of the present disclosure, as shown in FIG. 1A, the frame body 101 comprises a first side frame body 101a (hereinafter also referred to as a sky side portion), a second side frame body 101b (hereinafter also referred to as a right side portion), a third side frame body 101c (hereinafter also referred to as a left side portion), and a fourth side frame body 101d. The first side frame body 101a and the fourth side frame body 101d are disposed opposite to each other, the second side frame body 101b and the third side frame body 101c are disposed opposite to each other, the first side frame body 101a, the second side frame body 101b, the third side frame body 101c and the fourth side frame body 101d form a rectangular closed structure, and the first protrusion 102 and the second protrusion 103 both extend from the inner wall of each of the first side frame body 101a, the second side frame body 101b, the third side frame body 101c and the fourth side is frame body 101d. In some embodiments, the sky side portion 101a is detachably connected to the right side portion 101b and the left side portion 101c, e.g., connected by screws, and the fourth side frame body 101d is detachably connected to the left side portion 101c and the right side portion 101b, e.g., connected by screws. Such a design facilitates the production of the metal frame and can reduce the production cost.

In some embodiments, referring to FIG. 2A, in order to achieve basic display functions, in addition to the frame 1 and the planar back housing 2, the display device may further comprise: a light bar assembly 114, a reflective sheet 115, an optical structure layer 4, a front frame body 17, and other components.

Continuing to refer to FIG. 2A, the planar back housing 2 is fixedly connected to the side of the frame 1 away from the light emitting surface 3, the front frame body 17 is fixedly connected to the side of the frame 1 close to the light emitting surface 3, and the planar back housing 2, the frame 1 and the front frame body 17 form an accommodation chamber, which supports and spatially positions the light bar assembly 114, the optical structure layer 4, and the like accommodated therein.

Figure 3A:
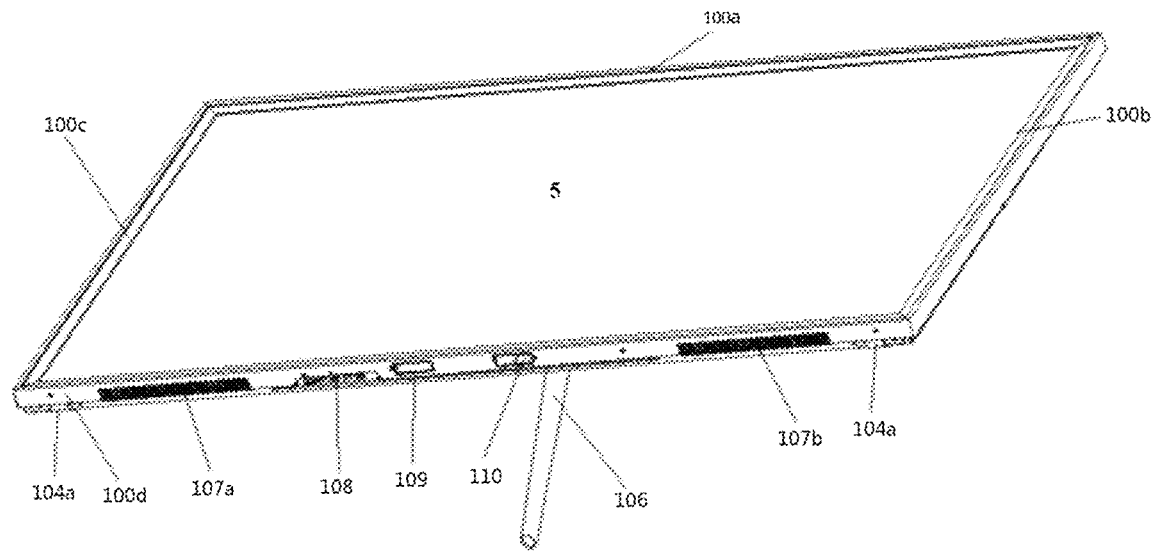
FIG. 3A is a three-dimensional schematic view of a display device provided by an embodiment of the present disclosure.
Figure 3B:
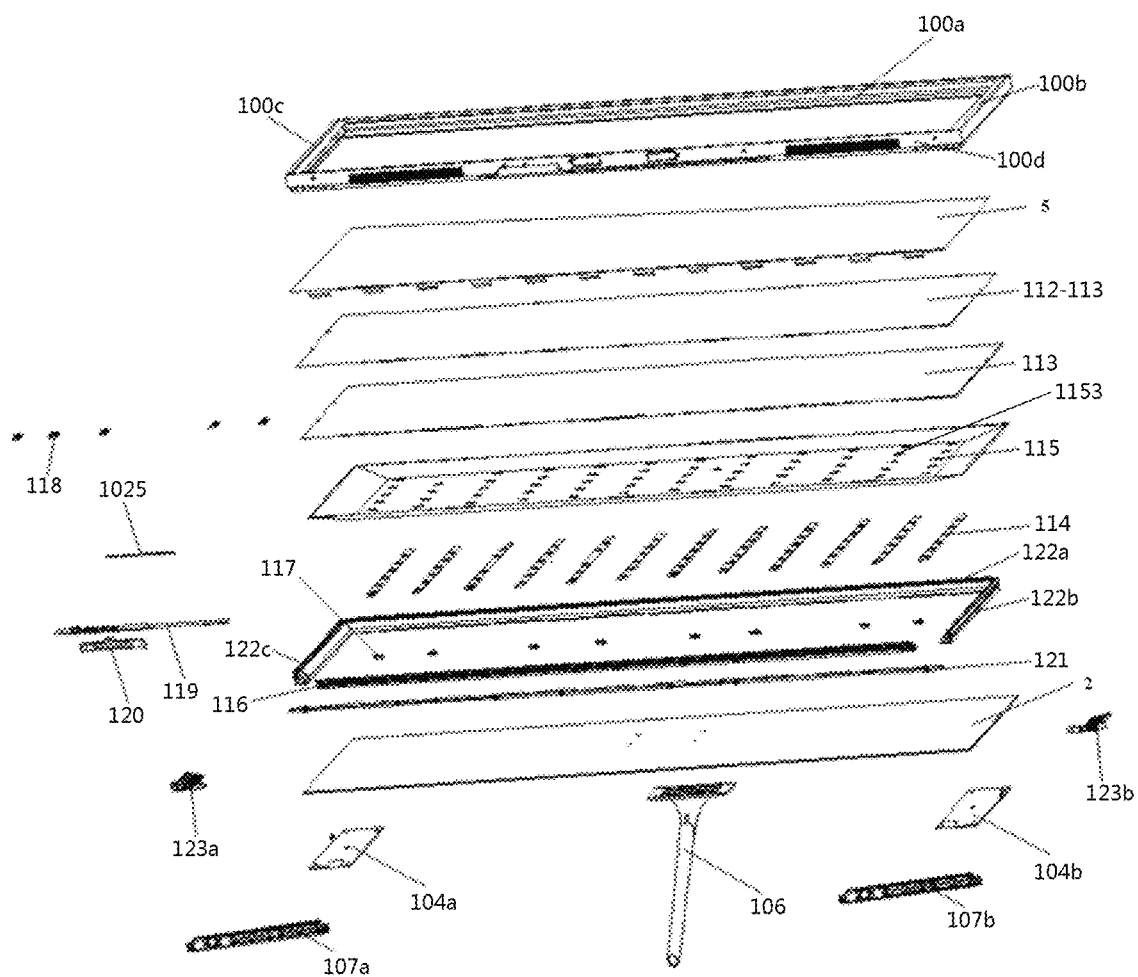
FIG. 3B is an exploded schematic view of a display device provided by an embodiment of the present disclosure.
Figure 4A:
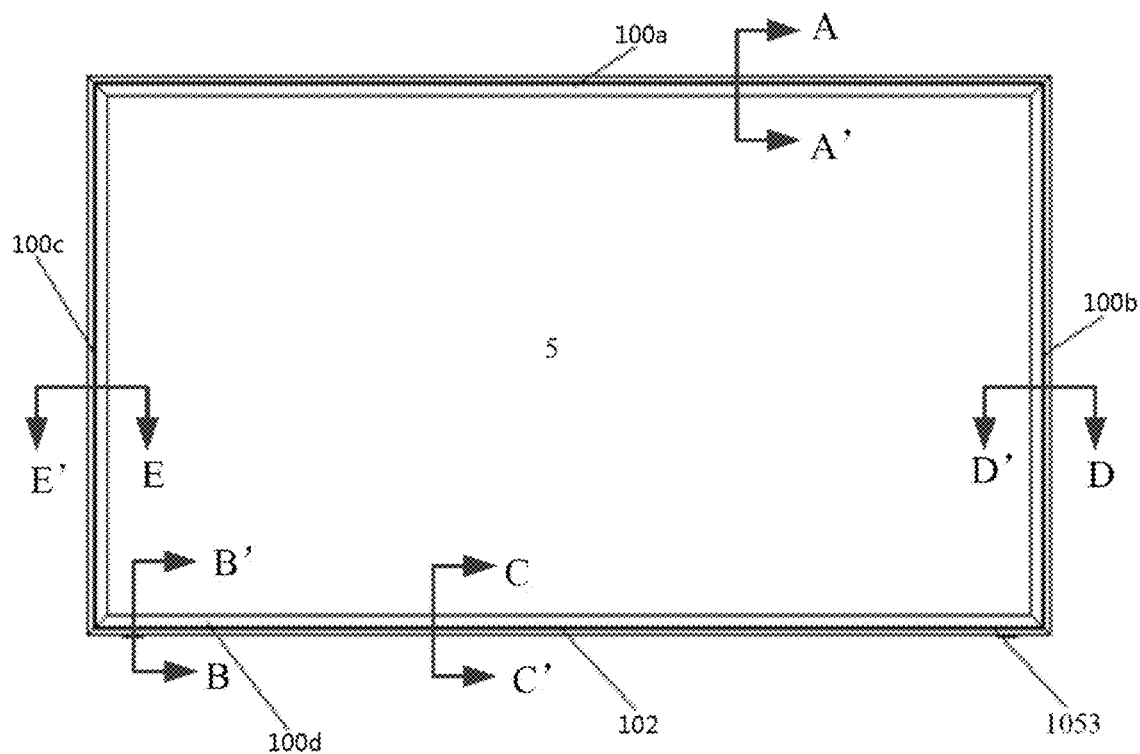
FIG. 4A is a front view of a display device provided by an embodiment of the present disclosure.
Figure 4B:
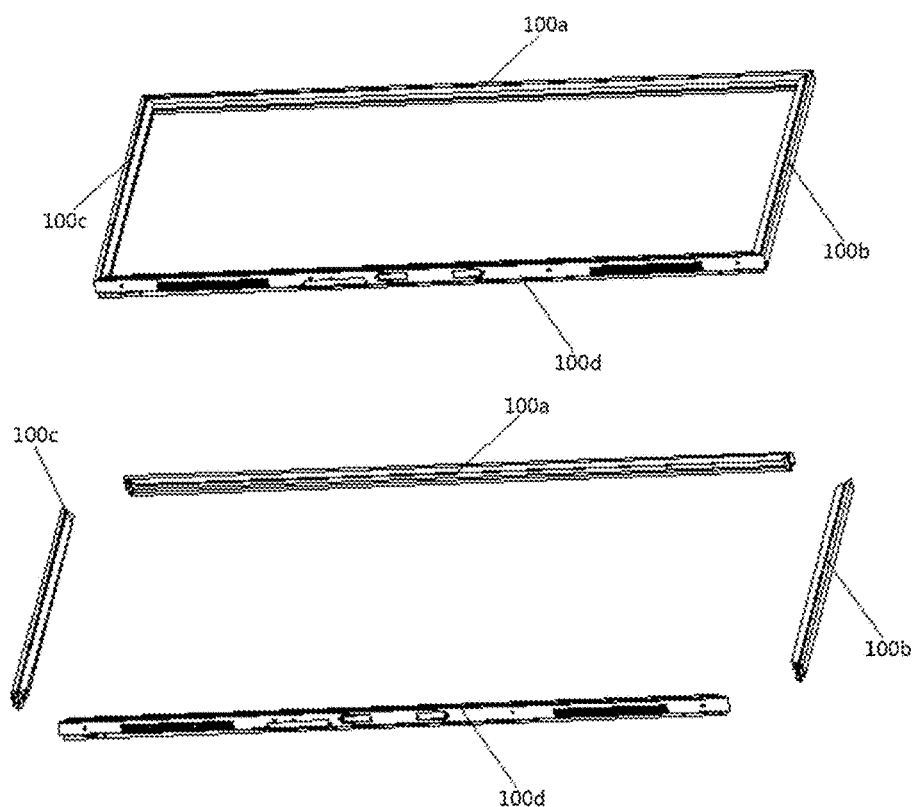
FIG. 4B is a schematic structural view of a front frame provided by an embodiment of the present disclosure.

In the accommodation chamber formed by the planar back housing 2, the frame 1 and the front frame body 17, the light bar assembly 114, the reflective sheet 115, the optical structure layer 4 (such as diffusion plate 113, prism sheet 112, diffusion sheet 111, etc. shown in FIG. 3B) and the display panel 5 are arranged successively in a direction away from the planar back housing 2. The light bar assembly 114 may employ an LED (Light Emitting Diode) light group, such as a plurality of light sources 151 (LED light bars or LED light panels) including a plurality of LED chips. The reflective sheet 115 has openings 1153 at positions corresponding to the plurality of light sources 151. In some embodiments, the display device may adopt a direct-type backlight structure. Referring to FIG. 2A, the light bar assembly 114 may be is evenly laid on the inner surface of the planar back housing 2, and light emitted by the light bar assembly 114 is uniformly transmitted to the display panel 5 through the optical structure layer such as the reflective sheet 115, the diffusion plate 113, the prism sheet 112 and the diffusion sheet 111. In order to make this design illustrated more concisely in the drawings, the diffusion sheet 111 is not shown in FIG. 2A.

In an embodiment of the present disclosure, as shown in FIG. 2A, the second protrusion 103 includes a first stepped portion 1031 and a second stepped portion 1032. The first stepped portion 1031 is closer to the frame body 101 than the second stepped portion 1032, and the stepped surface of the first stepped portion 1031 parallel to the light emitting surface 3 is closer to the light emitting surface 3 than the stepped surface of the second stepped portion 1032 parallel to the light emitting surface 3. The optical structure layer 4 of the display device is located on a side of the second stepped portion 1032 close to the light emitting surface 3 and located on the inner side of the first stepped portion 1031. The display panel 5 of the display device is located on a side of the first stepped portion 1031 close to the light emitting surface 3 and located on the inner side of the frame body 101.

Figure 2B:
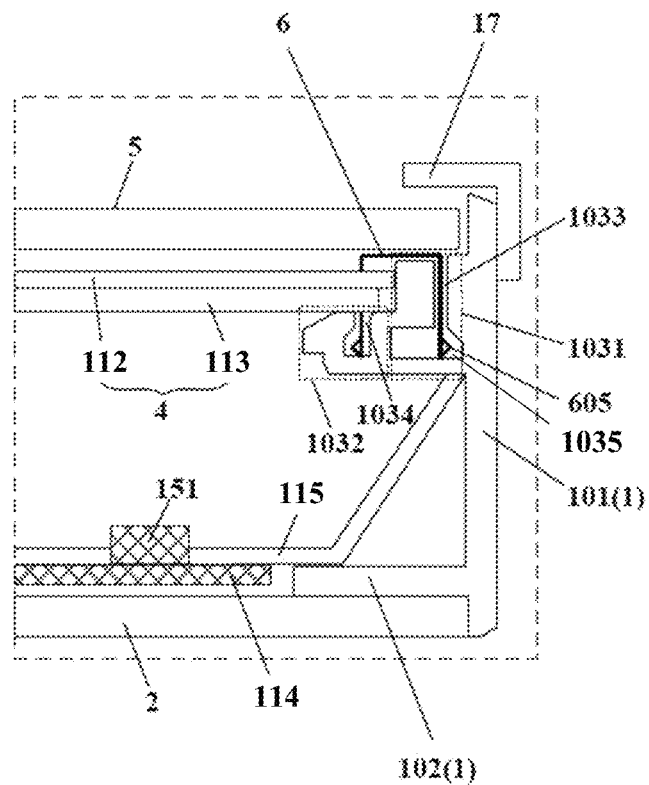
FIG. 2B is an enlarged view of P in FIG. 2A.
Figure 2C:
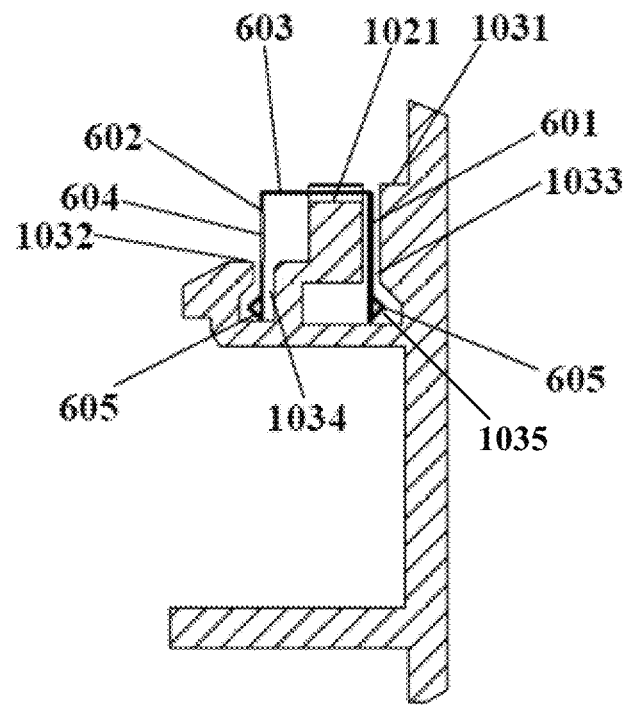
FIG. 2C is a sectional view of assembling a positioning elastic sheet with the frame in an embodiment of the present disclosure.
Figure 2D:
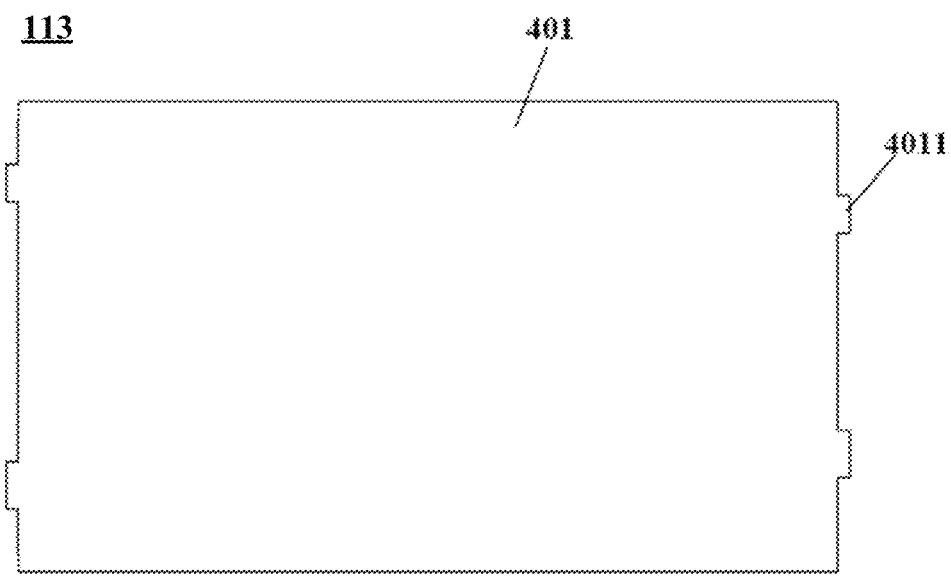
FIG. 2D is a front view of a diffusion plate in an embodiment of the present disclosure.

The display panel 5 is positioned in space by the first stepped portion 1031, the frame body 101 and the front frame body 17. Prior to assembling the display panel 5, the optical structure layer 4 also needs to be spatially positioned. As shown in FIG. 2B, the first stepped portion 1031 is provided with a first engaging slot 1033 on a side close to the light emitting surface 3, and the second stepped portion 1032 is provided with a second engaging slot 1034 on a side close to the light emitting surface 3. The display device further comprises a positioning elastic sheet 6. As shown in FIG. 2C, the positioning elastic sheet 6 includes a first engaging plate portion 601, a second engaging plate portion 602, and a connecting plate portion 603. The first engaging plate portion 601 is engaged with the first engaging slot 1033, the second engaging plate portion 602 is engaged with the second engaging slot 1034, and the second engaging plate portion 602 has a strip-shaped socket 604 extending parallel to the light emitting surface 3, wherein each positioning elastic sheet 6 is engaged with one first engaging slot 1033 and one second engaging slot 1034. As shown in FIG. 2D, taking the diffusion plate 113 in the optical structure layer 4 as an example, the edge of the diffusion plate 113 has a convex lug 4011, and the convex lug 4011 is inserted into the above-mentioned strip-shaped socket 604. In some embodiments, four convex lugs 4011 are designed on the edge of the diffusion plate 113 with two on left side and two on right side, which are asymmetrically distributed so as to prevent reverse arrangement upon assembly.

As shown in FIG. 2D, the convex lugs of the diffusion plate 113 at the corresponding positions are inserted into the strip-shaped sockets 604 of one positioning elastic sheet 6. Due to the asymmetrical design of the left and right convex lugs of the diffusion plate 113, the first engaging slot 1033 and the second engaging slot 1034 will not be seen from the left-side sections of the first stepped portion 1031 and the second stepped portion 1032, but can be seen from the right-side sections of the first stepped portion 1031 and the second stepped portion 1032. A similar design can be applied to other optical films in the optical structure layer 4, such as the prism sheet 112, the diffusion sheet 111, and the like.

In some embodiments, as shown in FIG. 2C, each of the first engaging plate portion 601 and the second engaging plate portion 602 is provided with a protruding hook 605 on a side away from the connecting plate portion, and the first engaging slot 1033 and the second engaging slot 1034 are each correspondingly provided with a hook groove 1035. The cooperation of the hook 605 and the hook groove 1035 enables mounting of the positioning elastic sheet on the frame.

Prior to assembling the diffusion plate 113, the positioning elastic sheet 6 is firstly assembled with the frame 1, and then the convex lug 4011 of the diffusion plate 113 is inserted into the strip-shaped socket 604 of the positioning elastic sheet 6 to dispose the diffusion plate 113 on the stepped surface of the second stepped portion 1032 that is parallel to the light emitting surface 3. Thereafter, other optical films are assembled in a similar manner. The above design enables the optical structure layer 4 to be positioned in space through the first stepped portion 1031, the second stepped portion 1032 and the positioning elastic sheet 6 after the assembly is completed.

In some embodiments, the positioning elastic sheet 6 may be a metal positioning elastic sheet or a plastic positioning elastic sheet. The number of positioning elastic sheets 6 and positions where they are arranged are not limited, which can be designed according to the specifications and dimensions of the display device. For example, in an embodiment, there are four positioning elastic sheets, two of which are arranged on the left side of the frame, and the other two are arranged on the right side of the frame.

In some embodiments, as shown in FIG. 2C, the stepped surface of the first stepped portion 1031 parallel to the light emitting surface 3 has a sink groove 1021 for accommodating the connecting plate portion 603, and the depth of the sink groove 1021 is not smaller than the thickness of the connecting plate portion 603. In this way, the connecting plate portion 603 does not protrude from the stepped surface of the first stepped portion 1031 parallel to the light emitting surface 3, so that damage to the display panel 5 can be reduced.

In some embodiments of the present disclosure, as shown in FIG. 1B, the fourth side frame body 101d has a ground side support frame portion 1011d in a direction parallel to the light emitting surface 3, and the ground side support frame portion 1011d is provided with a circuit board. The circuit board comprises: a display driving circuit board 711 is and a main board 119. The main board 119 includes an integrated system-on-chip (SOC) and a timing controller (T-CON). The display driving circuit board 711 and the main board 119 are connected by a flexible circuit. In this embodiment, the SOC and the T-CON are integrated, so that the circuit board can occupy less internal space of the device, and the size of the device can be further reduced. For example, the display driving circuit board 711 may include at least one of a data driving circuit board and a scan driving circuit board.

In some embodiments, the display driving circuit board 711 and the main board 119 at least partially overlap in a direction perpendicular to the light emitting surface 3. In this way, the area of the ground side support frame portion 1011d occupied by the display driving circuit board 711 and the main board 119 can be reduced, and the layout design of the electronic components on the ground side support frame portion 1011d can be optimized.

In addition, a loudspeaker 9 and an adapter plate 10 are further fixed on the ground side support frame portion 1011d. The loudspeaker 9 does not overlap with the display driving circuit board 711, the main board 119, the adapter plate 10 and other circuit boards in a direction perpendicular to the light emitting surface 3. There may be a plurality of loudspeakers 9, which can be arranged symmetrically with respect to the longitudinal center axis of the display device, so as to improve the sound effect. In some embodiments, as shown in FIGS. 1A and 1B, a pair of base mounting brackets 11 are further fixed at the left and right ends of the fourth side frame body 101d. Each of the pair of base mounting brackets 11 has a mounting socket 1111 with an opening facing the ground side. The pair of base mounting brackets 11 are hidden inside the display device, and will not affect the wall-hung mounting effect of the display device. When the display device does not need to be wall-mounted, but it is desired to directly place it on a table through a base, it is only required to insert a matching base (not is shown in the drawings) into a pair of mounting sockets 1111 of the pair of base mounting brackets 11. The user of the display device can flexibly choose the way of mounting the display device according to practical situations.

In some embodiments of the present disclosure, the frame body 101 comprises a front frame that surrounds the edge of the display panel 5, and a middle frame that is disposed in a space formed by the display panel 5, the front frame and the planar back housing 2. An inner cavity is formed between the middle frame, the front frame and the planar back housing 2, in which the circuit board is arranged.

Referring to FIGS. 3A and 3B, the front frame includes: a first side front frame 100a, a second side front frame 100b, a third side front frame 100c, and a fourth side front frame 100d, wherein the fourth side front frame 100d may also be called a ground side front frame, the first side front frame 100a and the fourth side front frame 100d are disposed opposite to each other, the second side front frame 100b and the third side front frame 100c are disposed opposite to each other, and the first side front frame 100a, the second side front frame 100b, the third side front frame 100c and the fourth side front frame 100d form a rectangular closed structure around the display panel 101. The middle frame includes: a first side middle frame 122a, a second side middle frame 122b, a third side middle frame 122c, and a fourth side middle frame 116, wherein the fourth side middle frame 116 may also be called a ground side middle frame, the first side middle frame 122a and the fourth side middle frame 116 are disposed opposite to each other, the second side middle frame 122b and the third side middle frame 122c are disposed opposite to each other, and the first side middle frame 122a, the second side middle frame 122b, the third side middle frame 122c and the fourth side middle frame 116 form a rectangular closed structure. The middle frame is used to form an inner cavity on the one hand, and to support the optical films, display panel, etc. of the is display device on the other hand.

In some embodiments, the front frame may be made of an aluminum alloy or plastic, and the material of the front frame is not limited. The middle frame may be made of an aluminum alloy or other metal materials, and the material of the middle frame is not limited.

In some embodiments, the fourth side middle frame includes a side wall plate inclined from the inner side to the edge of the display panel. The side wall plate forms a first inner cavity with the fourth side front frame and the planar back housing, and the circuit board is arranged in the first inner cavity.

Figure 5A:
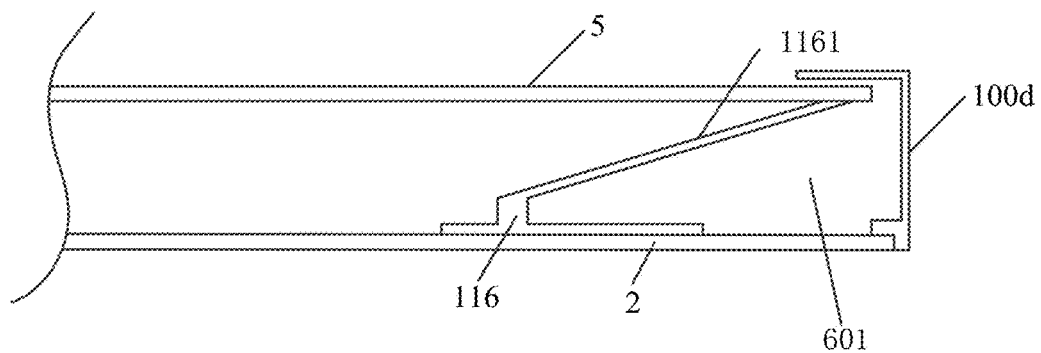
FIG. 5A is a schematic structural view of a first inner cavity to provided by an embodiment of the present disclosure.
Figure 5B:
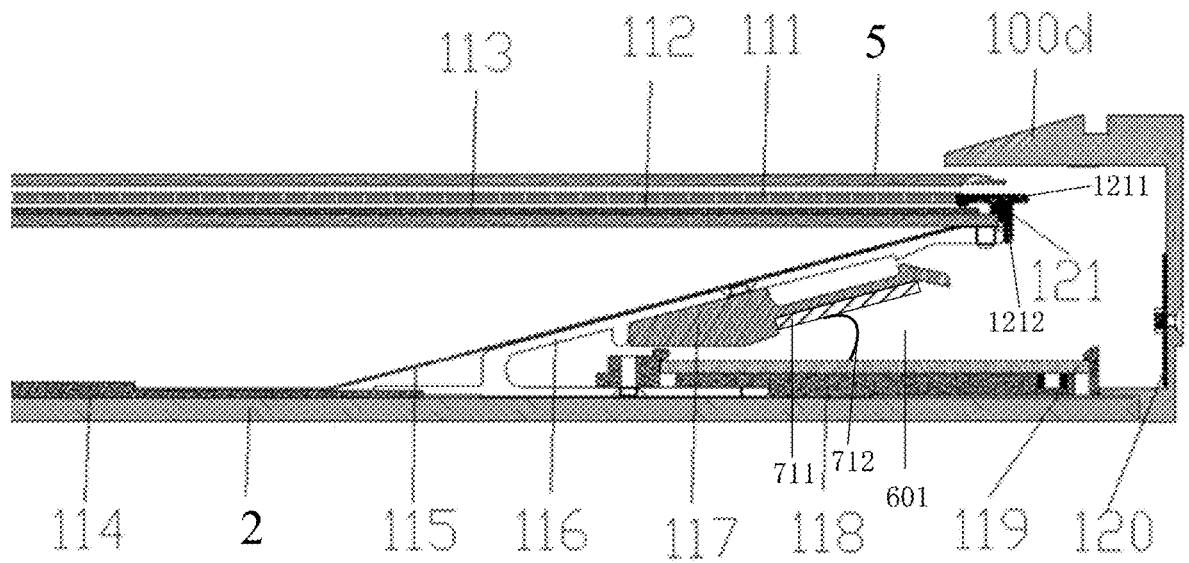
FIG. 5B is a sectional view taken along line C-C' in FIG. 4A according to an embodiment of the present disclosure.

Referring to FIGS. 5A and 5B, a first inner cavity 601 is formed between the fourth side middle frame (ground side middle frame) 116, the fourth side front frame (ground side front frame) 100d, and the planar back housing 2. The first inner cavity 601 is provided with a display driving circuit board 711 and a main board 119. The ground side middle frame 116 includes a side wall plate 1161 inclined from the inner side of the planar back housing 2 to the edge of the display panel 5, and the side wall plate 1161 forms a first inner cavity 601 with the ground side front frame 100d and the planar back housing 2. FIG. 5A illustrates how the inner cavity is formed between the middle frame, the front frame and the planar back housing, and does not limit the structure of the display device.

In related arts, a circuit board is usually arranged between the device housing and the module back panel. However, in some embodiments of the present disclosure, in the case where the planar back housing and the outer housing are integrated, the circuit board cannot be mounted between the device housing and the module back panel. Therefore, an inner cavity is formed between the middle frame, the front frame and the planar back housing provided by the present disclosure, and a circuit board is arranged in the inner cavity, so that this technical problem is solved and the overall thickness of the display is device is reduced at the same time.

In some embodiments, the display driving circuit board is fixed on a side of the side wall plate of the fourth side middle frame close to the first inner cavity by a first circuit board fixing member. The first circuit board fixing member includes a first mounting portion and a first engaging portion. The first mounting portion is fixedly mounted on the side of the side wall plate of the fourth side middle frame close to the first inner cavity, and the first engaging portion is used for fixing the display driving circuit board.

In some embodiments, the main board is fixed on a side of the planar back housing close to the display panel by a second circuit board fixing member. The second circuit board fixing member includes a second mounting portion and a second engaging portion. The second mounting portion is fixedly mounted on the side of the planar back housing close to the display panel, and the second engaging portion is used for fixing the main board.

Referring to FIG. 5B, the display device comprises: a first circuit board fixing member 117 and a second circuit board fixing member 118. The main board 119 is fixed on the side of the planar back housing 2 close to the display panel 5 by the second circuit board fixing member 118, and the display driving circuit board 711 is fixed on the side of the side wall plate 1161 of the fourth side middle frame 116 close to the first inner cavity 601 by the first circuit board fixing member 117. In one case, the first circuit board fixing member 117 and the second circuit board fixing member 118 may not appear in FIG. 5B at the same time, or in other words, the first circuit board fixing to member 117 and the second circuit board fixing member 118 may be located at different positions in the direction perpendicular to the paper direction (corresponding to FIG. 5B). Alternatively, in another case, the first circuit board fixing member 117 and the second circuit board fixing member 118 may also appear in FIG. 5B at the same time, and is the positions of the first circuit board fixing member 117 and the second circuit board fixing member 118 are not limited.

Figure 6A:
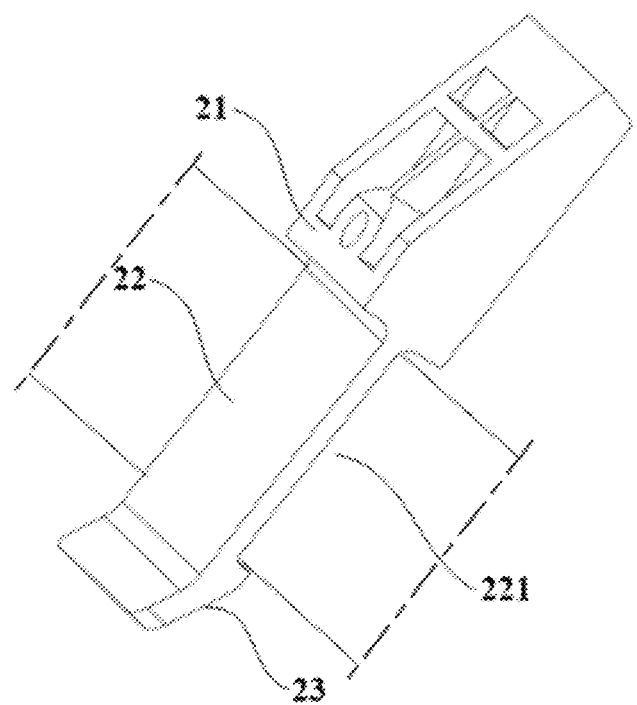
FIG. 6A is a schematic structural view of a first circuit board fixing member provided by an embodiment of the present disclosure.

In some embodiments, as shown in FIGS. 5B and 6A, the first circuit board fixing member 117 may include a first mounting portion 21, a first engaging portion 22, and an insertion guiding portion 23. The first engaging portion 22 has a slot 221 for engaging with the display driving circuit board 711, and the insertion guiding portion 23 is located on a side of the first engaging portion 22 away from the first mounting portion 21 and has a guiding inclined surface to facilitate the insertion of the display driving circuit board 711.

Figure 6B:
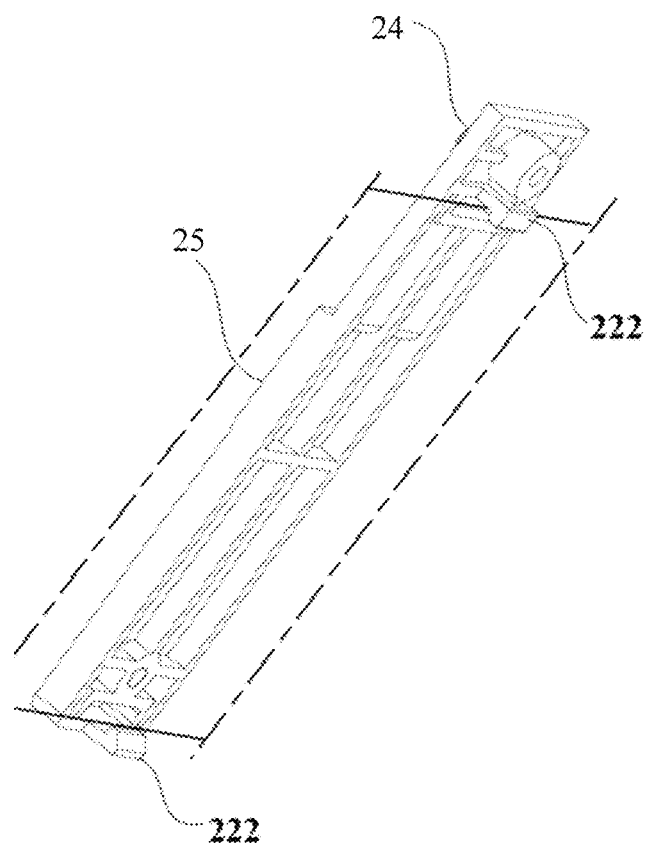
FIG. 6B is a schematic structural view of a second circuit board fixing member provided by an embodiment of the present disclosure.

In some embodiments, as shown in FIGS. 5B and 6B, the second circuit board fixing member 118 may include a second mounting portion 24 and a second engaging portion 25, and the second engaging portion 25 includes a pair of hooks 222 which are disposed opposite to each other and have opposite engaging directions, and the pair of hooks 222 are used for engaging with the main board 119.

The display driving circuit board 711 and the main board 119 are fixed on different planes respectively, and the display driving circuit board 711 and the main board 119 are connected by a flexible circuit 712.

Alternatively, the display driving circuit board or the main board may also be fixed by any one of the following fixing methods: engagement, screwing, fixing by elastic sheets, etc., which is not specifically limited.

In some embodiments, the display device may further comprise: an inner frame 121 disposed between the fourth side middle frame and the fourth side front frame. The inner frame 121 includes a first inner frame wall 1211 and a second inner frame wall 1212 that are perpendicular to each other. The first inner frame wall 1211 is used to support the display panel 5, and the second inner frame wall 1212 is connected to the fourth side middle frame and used to limit the position is of the optical structure layer of the display device.

Referring to FIGS. 3B and 5B, the inner frame 121 is disposed between the ground side middle frame 116 and the ground side front frame 100d, and includes a first inner frame wall 1211 and a second inner frame wall 1212. The second inner frame wall 1212 of the inner frame 121 plays the role of limiting the position of the optical films (for example, the diffusion sheet 111, the prism sheet 112, and the diffusion plate 113 shown in FIG. 5B). In addition, the first inner frame wall 1211 is connected to the ground side front frame 100d, and the second inner frame wall 1212 is connected to the ground side middle frame 116, so that the inner frame 121 is fixedly connected to the front frame and the middle frame. For example, the first inner frame wall 1211 and the ground side front frame 100d may be connected by screws, and the second inner frame wall 1212 is engaged with the ground side middle frame 116.

Figure 7:
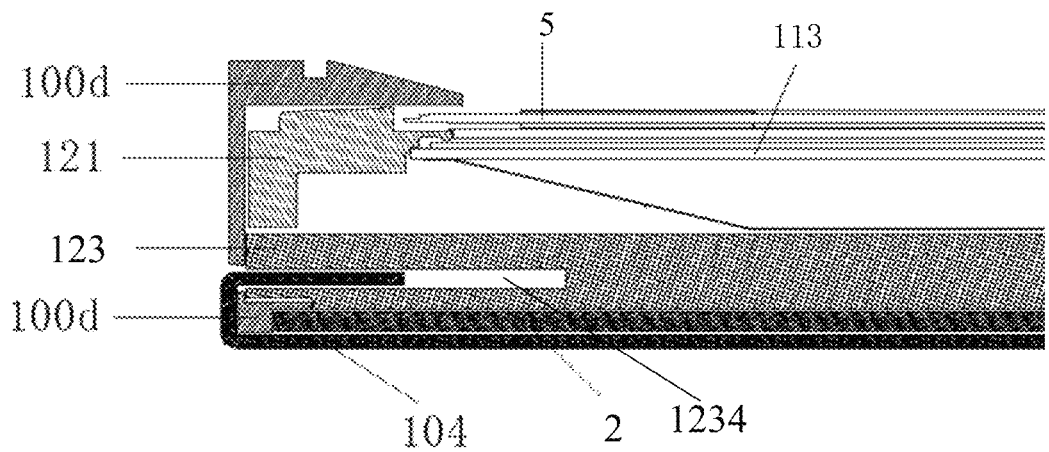
FIG. 7 is a sectional view taken along line B-B' in FIG. 4A according to an embodiment of the present disclosure.

As shown in FIG. 5B, the inner frame 121 is disposed on the ground side of the display device, and the inner frame 121 has a long strip shape. The sectional shapes of the edge portions (portions close to the left and right edges of the display device) and the sectional shape of the middle portion of the inner frame 121 may be the same or different. For example, the inner frame 121 in FIG. 7 may be understood as an edge portion of the inner frame, and the inner frame 121 in FIG. 5B may be understood as a middle portion of the inner frame, which have different sectional shapes. In FIG. 7, the inner frame 121 is connected to the front frame on the one hand, and plays the role of supporting the optical structure layer and the display panel and limiting the position of them on the other hand.

In some embodiments, the inner frame 121 may be a plastic cement inner frame, which has good physical elasticity and can play a role of protecting the display panel 5. For example, if the display device drops, the plastic cement inner frame can protect the display panel 5 to reduce is damages thereto.

The inner frame 121 plays the role of supporting the display panel 5 on the one hand, and plays the role of fixedly connecting the middle frame and the front frame on the other hand. In the above-mentioned embodiment, the side wall plate 1161 of the ground side middle frame 116 is inclined from the inner side of the planar back housing 2 to the edge of the display panel 5. In this way, for the ground side, the supporting effect of the middle frame on the display panel 5 is weakened. In this embodiment, the inner frame 121 is combined to support the display panel 5 to improve the stability of the display panel 5.

In addition, referring to FIGS. 5A and 5B, the side wall plate 1161 is attached to the reflective sheet 115.

In some embodiments, each of the first side front frame 100a, the second side front frame 100b, and the third side front frame 100c includes an engaging portion. The first side middle frame 122a is provided with a guide rail on a side close to the first side front frame 100a, the second side middle frame 122b is provided with a guide rail on a side close to the second side front frame 100b, and the third side middle frame 122c is provided with a guide rail on a side close to the third side front frame 100c. The first side front frame 100a, the second side front frame 100b and the third side front frame 100c are fixedly connected to the first side middle frame 122a, the second side middle frame 122b and the third side middle frame 122c respectively by means of cooperation between the engaging portion and the guide rail.

Figure 8A:
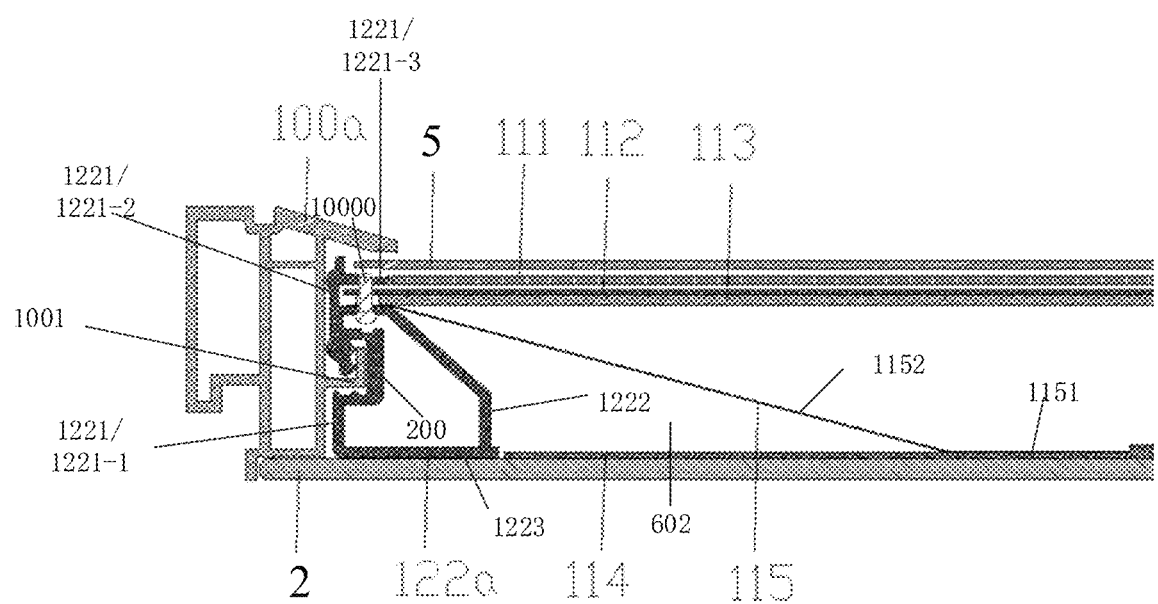
FIG. 8A is a sectional view taken along line A-A' in FIG. 4A according to an embodiment of the present disclosure.

In some embodiments, referring to FIGS. 3B and 8A, the first side front frame 100a includes an engaging portion 1001, and the first side middle frame 122a is provided with a guide rail 200 on a side close to the first side front frame 100a. The guide rail 200 of the first side middle frame 122a and the engaging portion 1001 of the first side front frame 100a are fitted together in a pull-out manner.

Figure 8B:
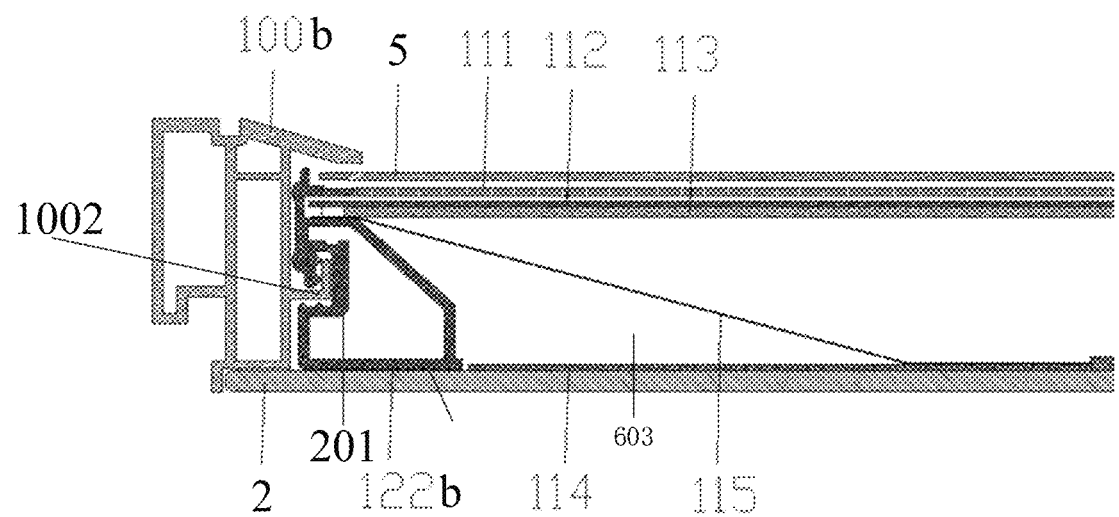
FIG. 8B is a sectional view taken along line D-D' in FIG. 4A according to an embodiment of the present disclosure.

Similar to the case of the first side front frame 100a, as shown in FIG. 8B, the second side front frame 100b includes an engaging portion 1002, and the second side middle frame 122b is provided with a guide rail 201 on a side close to the second side front frame 100b. The guide rail 201 of the second side middle frame 122b and the engaging portion 1002 of the second side front frame 100b are fitted together in a pull-out manner. The third side front frame 100c includes an engaging portion 1003, and the third side middle frame 122c is provided with a guide rail 202 on a side close to the third side front frame 100c. The guide rail 202 of the third side middle frame 122c and the engaging portion 1003 of the third side front frame 100c are fitted together in a pull-out manner. The ground side front frame 100d is detachably connected to the non-ground side front frames 100a, 100b and 100c, e.g., connected by screws.

For example, the process of mounting the display device may include: fixing the middle frame on the planar back housing 2: the four side middle frames may be fixed on the planar back housing 2 respectively according to the sequence of sky side, left/right side, ground side (or according to the sequence of 122a→122b/122c→116), and the sequence of fixing is not limited.

The light bar assembly 114, the reflective sheet 115, the optical structure layer 4 (the diffusion plate 113, the prism sheet 112, the diffusion sheet 111, etc.) and the display panel 5 are fixed on the planar back housing 2 successively.

The non-ground side middle frames 122a, 122b and 122c are provided with guide rails on the outer sides, and the non-ground side front frames 100a, 100b and 100c are provided with engaging portions that cooperate with the guide rails so that 100a, 100b and 100c are mounted on the outer sides of 122a, 122b and 122c in a pull-out manner.

Then, the ground side front frame 100d and the ground side middle is frame 116 are connected by screws. The ground side front frame 100d and the non-ground side front frames 100a, 100b and 100c are detachably connected.

In this embodiment, the front frame and the middle frame are fitted together in a pull-out manner, so that the process is simple and the cost is low.

In an embodiment, each of the first side middle frame 122a, the second side middle frame 122b, and the third side middle frame 122c includes: a first middle frame wall, a second middle frame wall, and a third middle frame wall.

The first middle frame wall includes a guide rail side wall, a position limiting side wall, and a supporting side wall. The guide rail is disposed on the guide rail side wall, the position limiting side wall is used to limit the position of the optical structure layer and the display panel of the display device, and the supporting side wall is used to support the optical structure layer and the display panel of the display device. The second middle frame wall supports the optical structure layer and the display panel of the display device. The third middle frame wall is parallel to the surface of the planar back housing facing the display panel, and at least a portion of the third middle frame wall is in contact with the planar back housing.

Referring to FIG. 8A, the first side middle frame 122a includes a first middle frame wall 1221, a second middle frame wall 1222, and a third middle frame wall 1223. The first middle frame wall 1221 is provided with a guide rail 200, and the first middle frame wall 1221 is used to limit the position of the optical structure layer (111, 112, 113) of the display device and the display panel 5. The second middle frame wall 1222 supports the optical structure layer (111, 112, 113) of the display device and the display panel 5. The third middle frame wall 1223 is parallel to the surface of the planar back housing 2 facing the display panel 5, and at least a portion of the third middle frame wall 1223 is in contact with the planar back housing 2.

The first middle frame wall 1221 includes a guide rail side wall 1221-1, a position limiting side wall 1221-2, and a supporting side wall 1221-3. The guide rail 200 is disposed on the guide rail side wall 1221-1, the position limiting side wall 1221-2 is used to limit the position of the optical structure layer (111, 112, 113) of the display device and the display panel 5, and the supporting side wall 1221-3 is used to support the optical structure layer (111, 112, 113) of the display device and display panel 5.

In some embodiments, referring to FIGS. 3B, 5B and 8A, the light bar assembly 114 is disposed on the side of the planar back housing 2 facing the display panel 5 and is in contact with the planar back housing 2. The reflective sheet 115 is disposed on the side of the light bar assembly 114 facing the display panel 5. The reflective sheet 115 includes a first reflective portion 1151 and a second reflective portion 1152. The first reflective portion 1151 is parallel to the surface of the planar back housing 2 facing the display panel 5, and the second reflective portion 1152 forms an angle with respect to the surface of the planar back housing 2 facing the display panel 5. As shown in FIG. 3B, the first reflective portion 1151 is provided with a plurality of openings 1153, and each light source on the light bar assembly 114 penetrates one of the plurality of openings 1153. At least a portion of the first reflective portion 1151 is in contact with the planar back housing 2. As shown in FIG. 8A, the reflective sheet 115 forms a second inner cavity 602 with the planar back housing 2 and the second middle frame wall 1222.

The non-ground side middle frames 122a, 122b and 122c have similar situations. In FIG. 8A, the second inner cavity 602 is illustrated by taking 122a as an example. The second inner cavity 602 communicates with the first inner cavity 601, and a circuit board is arranged in the first inner cavity 601.

In some embodiments, as shown in FIG. 8A, the optical structure is layer 4 (for example, the diffusion sheet 111, the prism sheet 112, and the diffusion plate 113), the second reflective portion 1152 of the reflective sheet 115, and the middle frame are fixedly connected by a fastening element 10000.

In some embodiments, the first side middle frame, the planar back housing and the reflective sheet form the second inner cavity. The second side middle frame, the planar back housing and the reflective sheet form the third inner cavity. The third side middle frame, the planar back housing and the reflective sheet form the fourth inner cavity. The fourth side middle frame (as described above, the reflective sheet is attached to the side wall plate of the fourth side middle frame), the fourth side front frame and the planar back housing form the first inner cavity. Each of the first side front frame, the second side front frame, and the third side front frame includes an engaging portion. The first side middle frame is provided with a guide rail on a side close to the first side front frame, and the engaging portion of the first side front frame is fixedly connected to the first side middle frame through the guide rail of the first side middle frame. The second side middle frame is provided with a guide rail on a side close to the second side front frame, and the engaging portion of the second side front frame is fixedly connected to the second side middle frame through the guide rail of the second side middle frame. The third side middle frame is provided with a guide rail on a side close to the third side front frame, and the engaging portion of the third side front frame is fixedly connected to the third side middle frame through the guide rail of the third side middle frame.

Figure 8C:
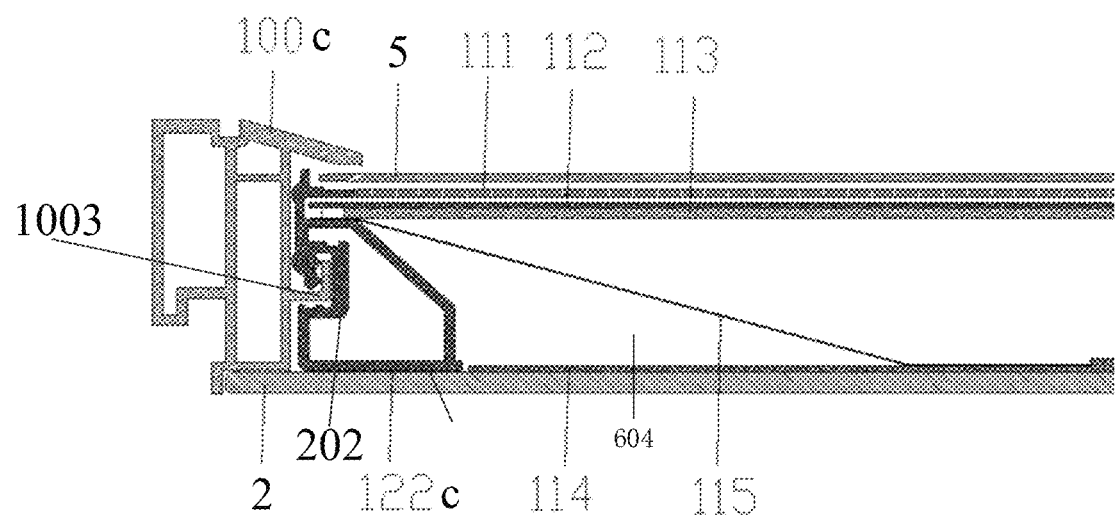
FIG. 8C is a sectional view taken along line E-E' in FIG. 4A according to an embodiment of the present disclosure.

In the diagram shown in FIG. 3B, the front frame includes 100a, 100b, 100c and 100d, and the middle frame includes 122a, 122b, 122c and 116. With reference to FIGS. 5A and 5B, the fourth side front frame 100d, the reflective sheet 115 and the planar back housing 2 can form a first inner cavity 601, and a circuit board (such as a display is driving circuit board 711 and a main board 119) can be arranged in the first inner cavity 601. As shown in FIG. 8A, the first side middle frame 122a, the reflective sheet 115 and the planar back housing 2 can form a second inner cavity 602. As shown in FIG. 8B, the second side middle frame 122b, the reflective sheet 115 and the planar back housing 2 can form a third inner cavity 603. As shown in FIG. 8C, the third side middle frame 122c, the reflective sheet 115 and the planar back housing 2 can form a fourth inner cavity 604. 122a, 122b and 122c are each provided with a guide rail, and 100a, 100b and 100c are each provided with an engaging portion. The engaging portion of 100a is fixedly connected to 122a through the guide rail of 122a, the engaging portion of 100b is fixedly connected to 122b through the guide rail of 122b, and the engaging portion of 100c is fixedly connected to 122c through the guide rail of 122c.

In some embodiments, the display device further comprises a functional component. The functional component includes one or more of: a voice component, a network component, a Bluetooth component, and an infrared photosensitive component, and the functional component is disposed in the first inner cavity.

Figure 9:
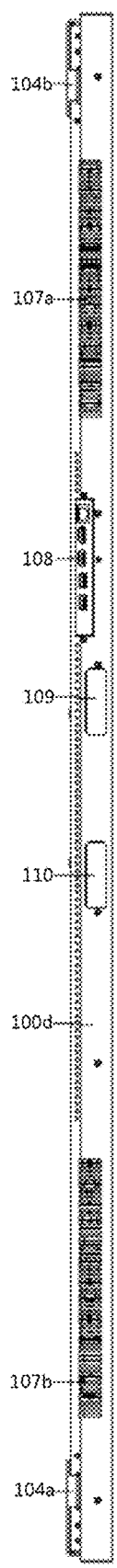
FIG. 9 is a ground side schematic view of a display device provided by an embodiment of the present disclosure.
Figure 11A:
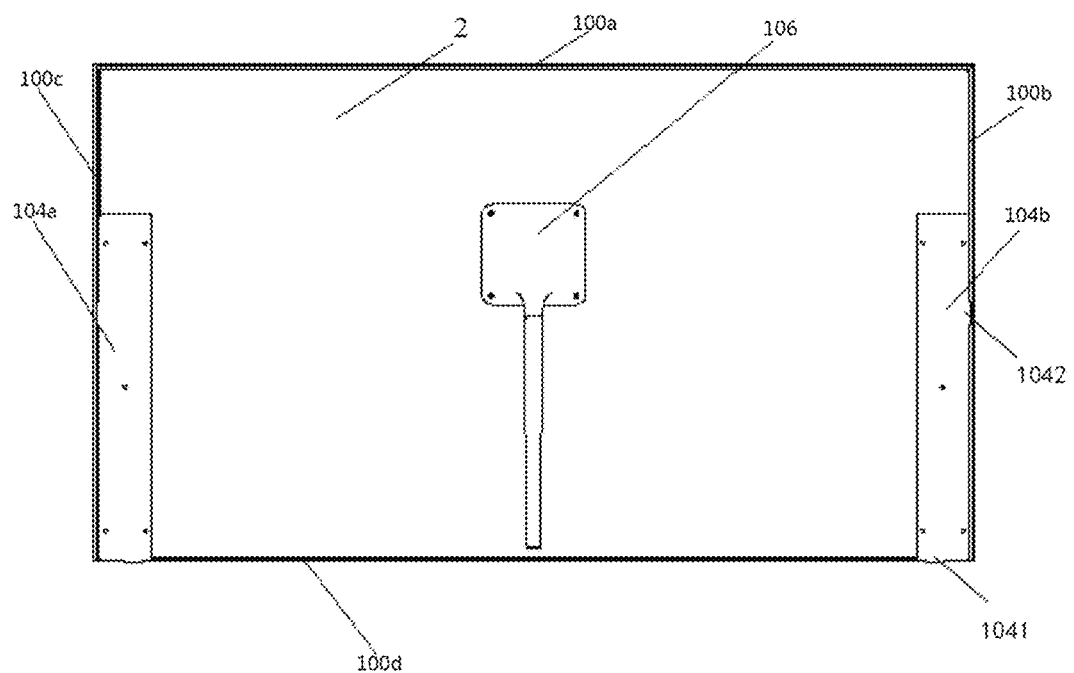
FIG. 11A is a rear view of a display device provided by an embodiment of the present disclosure.
Figure 11B:
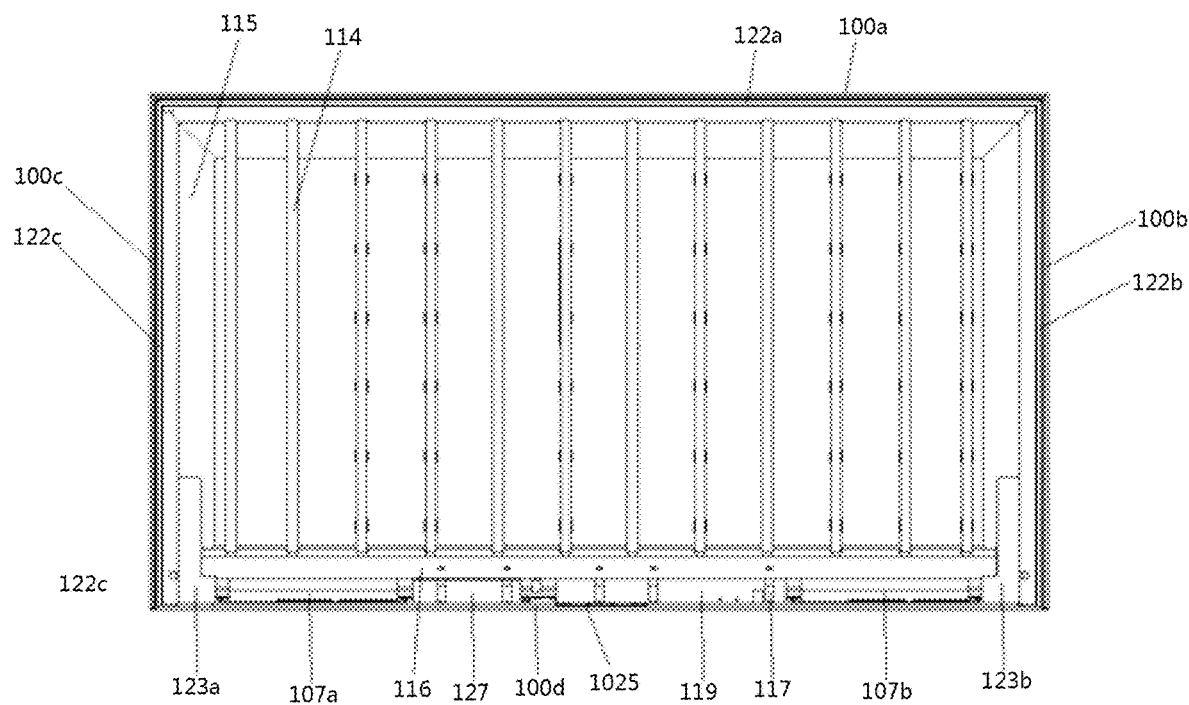
FIG. 11B is a schematic structural view of a display device with a planar back housing removed provided by an embodiment of the present disclosure.

For example, referring to FIGS. 3B, 9 and 11B, the voice component may include microphones 107a and 107b, and the microphones 107a and 107b are used for playing sounds. The network component may include a WIFI component 109, or may also include a network cable socket, and the display device may be connected to the network through the network component. The display device can perform Bluetooth connection with other devices through a Bluetooth component 110. The infrared photosensitive component can receive an infrared light signal sent by a remote controller, so the display device can be controlled by the remote controller.

In some cases, since many components are disposed in the first inner cavity, it is not suitable to fit the ground side middle frame 116 is and the ground side front frame 100*d* together in a pull-out manner. The above-mentioned embodiments may be adopted: the non-ground side front frames 100*a*, 100*b* and 100*c* are mounted on the outer sides of 122*a*, 122*b* and 122*c* in a pull-out manner; the ground side front frame 100*d* and the ground side middle frame 116 are connected by screws; the ground side front frame 100*d* and the non-ground side front frames 100*a*, 100*b* and 100*c* are detachably connected. In this way, three side front frames are connected in a pull-out manner, and one side front frame is connected by screws, which not only simplifies the process and reduces the cost, but also takes into account the special structures of the ground side front frame and middle frame.

Figure 10A:
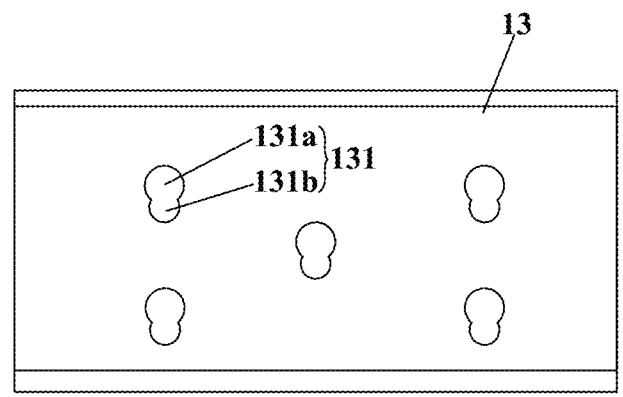
FIG. 10A is a front view of a wall-hung plate in an embodiment of the present disclosure.
Figure 10B:
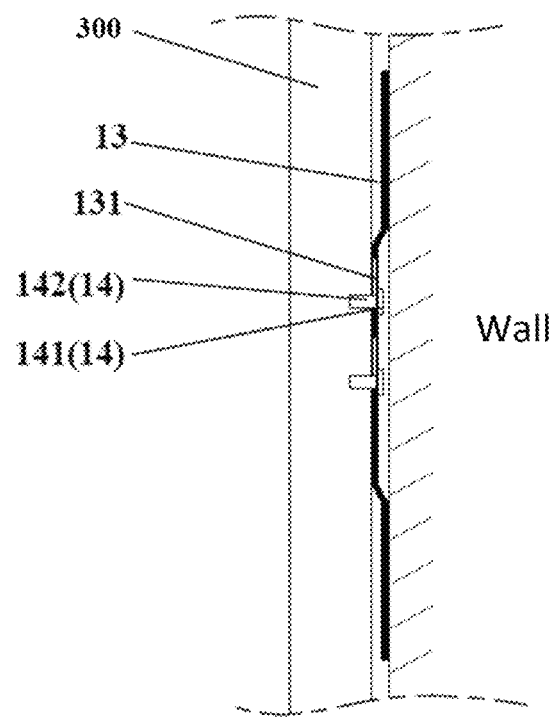
FIG. 10B is a schematic view illustrating a hanger hanging on the wall-hung plate in an embodiment of the present disclosure.

In some embodiments, as shown in FIGS. 10A and 10B, the display device further comprises: a wall-hung plate 13 for fixed connection to the wall. The wall-hung plate 13 has a plurality of hanging holes 131, and a plurality of hangers 14 fixed on a side of the planar back housing 2 away from the light emitting surface 3. The plurality of hangers 14 can be hung in the plurality of hanging holes 131 at corresponding positions of the wall-hung plate 13.

As shown in FIGS. 10A and 10B, the hanger 14 may employ a bolt. The hanging hole 131 includes a first portion 131*a* and a second portion 131*b* associated with each other. The aperture of the first portion 131*a* is larger than the diameter of a nut 141 of the bolt, the second portion 131*b* is closer to the ground side of the display device than the first portion 131*a*, and the aperture of the second portion 131*b* is larger than the diameter of a screw 142 of the bolt and smaller than the diameter of the nut 141 of the bolt.

When the display device is being wall-mounted, the wall-hung plate 13 is firstly fixed to the wall with expansion bolts; then the display device is lifted, and bolts on the back of the display device that are used as the hangers 14 are inserted into the first portions 131*a* of the hanging holes 131; after releasing the display device, under the is effect of gravity, the bolts fall into the second portions 131*b* of the hanging holes 131, so that they are prevented from falling out of the hanging holes 131. This mounting method is not only simple, but also reliable and safe. When it is necessary to detach the display device from the wall, it is only required to lift the display device so that the bolts enter the first portions 131*a* of the hanging holes 131, and then take out the display device.

In the foregoing embodiments of the present disclosure, the specific type of the display device is not limited, for example, it may be a television or a painted screen. The display device may be wall-mounted or directly placed on a table through a base. When the wall-mounted method is adopted, the display device can be almost attached to the wall, so that the back is not easy to accumulate dust, and the mounting effect is better.

In other embodiments, as shown in FIGS. 7 and 11A-11C, the display device further comprises: a wall-hung support member 123 embedded in the inner surface of the edge of the planar back housing 2. The wall-hung support member 123 is provided with a mounting groove 1234 for fixed connection to the hook-shaped wall-hung member 104, and the wall-hung member 104 is used for fixing the display device.

The display device may be hung and fixed on a wall or other mounting positions by the wall-hung member 104. For example, the wall-hung member 104 may be firstly fixed on a wall or other mounting positions; the display device is then fixedly connected to the wall-hung member 104. Referring to FIG. 7, the edge of the wall-hung to member 104 is bent and inserted into the mounting groove 1234 of the wall-hung support member 123, so that the display device is fixedly connected to the wall-hung member 104.

Referring to FIG. 11A, the left and right sides of the rear surface of the display device may be connected to wall-hung members 104*a* and is 104*b*, respectively. A floor bracket 106 in FIG. 11A is an optional component. In an application scenario where the display device is hung and fixed, the floor bracket 106 may be not arranged.

Corresponding to the wall-hung members 104*a* and 104*b* in FIG. 11A, the left and right sides of the rear surface of the display device in FIG. 11B are provided with wall-hung support members 123*a* and 123*b*, respectively, wherein the mounting groove of 123*a* is used for fixed connection to the wall-hung member 104*a*, and the mounting groove of 123*b* is used for fixed connection to the wall-hung member 104*b*.

Figure 11C:
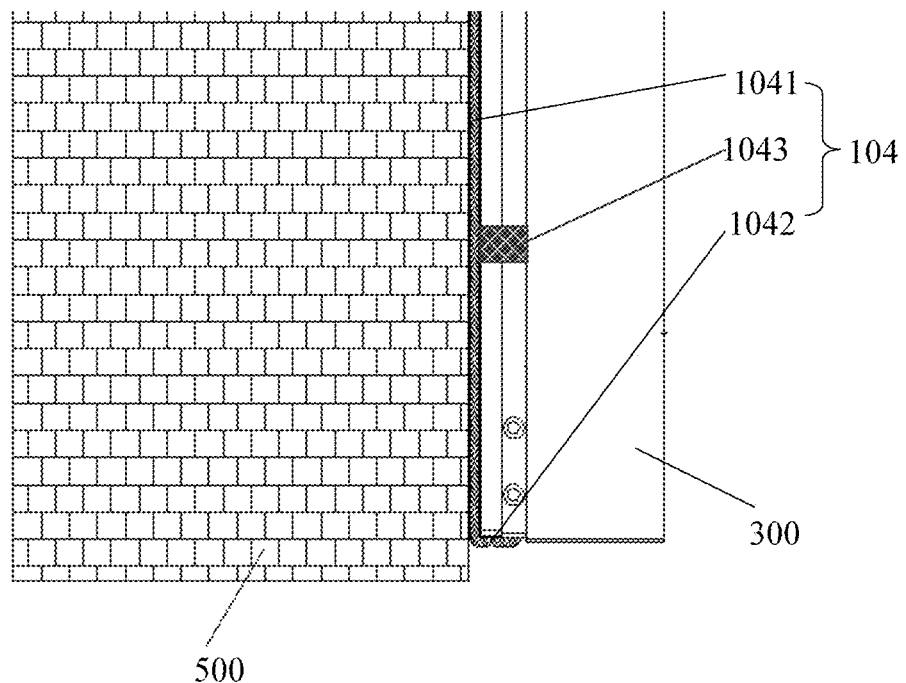
FIG. 11C is a schematic view illustrating hanging and mounting a display device provided by an embodiment of the present disclosure.

Referring to FIG. 11C, the display device 300 may be attached to a wall 500 (or other mounting positions) by the wall-hung member 104. In this way, the distance between the display device 300 and the wall 500 (or other mounting positions) is reduced, so that the back of the display device 300 is flatter and simpler, and the sides thereof are more aesthetic.

In this embodiment, in a first aspect, the display device 300 and the wall-hung member 104 are mounted separately. If the wall-hung member 104 fails, the wall-hung member 104 can be replaced separately without the need to repair the display device 300 as a whole. Firstly, the wall-hung member 104 is fixed on the wall 500 by screws, and then the display device 300 is fixed on the wall through the wall-hung member 104. In a second aspect, the display device 300 is attached to the wall 500 (or other mounting positions) by means of cooperation between the wall-hung member 104 and the wall-hung support member of the display device 300. As a result, the distance between the display device 300 and the wall 500 (or other mounting positions) is reduced to make the back of the display device 300 flatter and simpler, and the sides thereof more aesthetic.

In some embodiments, referring to FIG. 11C, the wall-hung member 104 may include a main body portion 1041, a bearing portion 1042, and a position limiting portion 1043. The main body portion 1041 has a plate-like structure with a small thickness, which can ensure the planar back housing of the display device 300 is tightly attached to the wall 500. The bearing portion 1042 bears the display device 300 at its lower side. The position limiting portion 1043 protrudes in a direction perpendicular to the main body portion 1041 to limit a relative movement between the wall-hung member 104 and the display device 300. The wall-hung member 104 may be made of a metal material.

Figure 12:
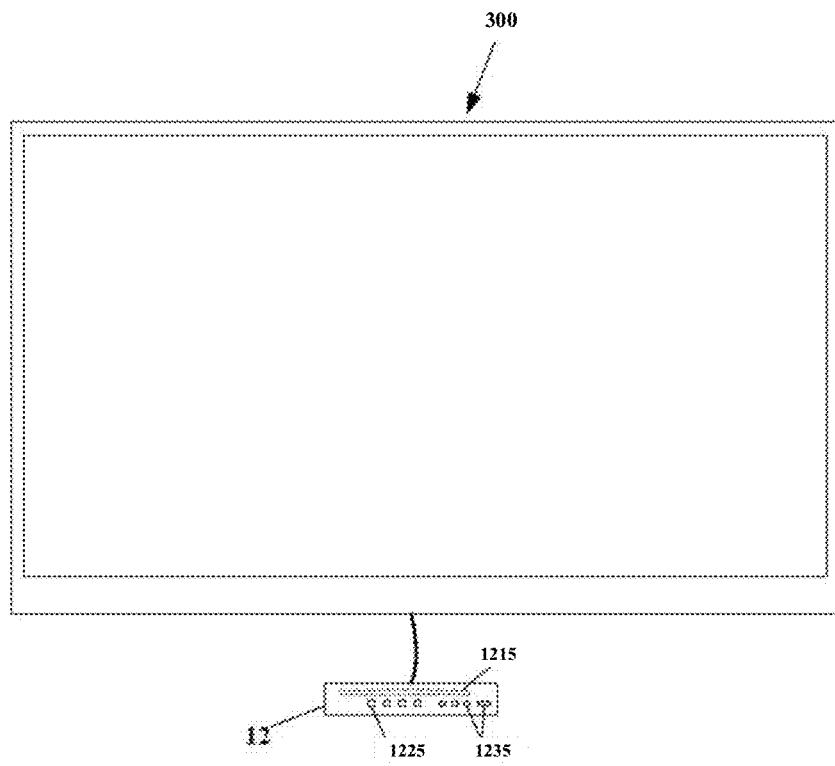
FIG. 12 is a front view of a display device according to an embodiment of the present disclosure.

In some embodiments, as shown in FIG. 12, the display device 300 further comprises an external host 12, and the external host 12 is integrated with a main board 1215, at least one operation button 1225 and at least one interface 1235. By arranging the main board 1215, the operation button 1225 and the interface 1235 in an external host 12, the structural design of the main body of the display device can be simplified to make the thickness smaller and the appearance slimmer. The external host 12 may be connected in a wired manner to the main body of the display device through a cable, or wirelessly connected to the main body of the display device in a wireless manner such as Bluetooth. The external host 12 can be placed on a table and can be moved flexibly within a certain range, thereby facilitating its use.

In some embodiments, referring to FIG. 11B, the ground side of the display device is further provided with a pick-up device 1025 for picking up user voice data. Referring to FIG.

9, the ground side of the display device is also provided with an SOC component 108 for providing a display signal for the display panel 5 and controlling the backlight, the acoustic system, etc. Referring to FIG. 5B, the first inner cavity 601 is further provided with a terminal board 120 attached to the front frame 100d so as to provide different terminal interfaces for the circuit board. As a result, compared with the case where the front frame 100d provides terminal interfaces, the processing process for the front frame 100d is simplified.

In some embodiments, a solid adhesive or liquid adhesive can be used to fix the planar back housing 2 and the middle frame, and the middle frame may be made by splicing aluminum profiles, which strengthens the planar back housing 2. Moreover, the middle frame is easy to assemble and transport, which can reduce the cost of device.

For example, the display device may be a display apparatus, such as a television or other display screens, which is not limited.

In the case where the embodiments of the present disclosure are applied, in a first aspect, the planar back housing forms the rear surface of the display device. That is to say, in this solution, the back panel and the outer housing are integrated. The planar back housing not only serves as the module back panel to support other components in the module, but also serves as the outer housing of the display device. In this way, compared with the structure in which the back panel is disposed inside the outer housing, the thickness of the device is reduced. In a second aspect, in related solutions, a circuit board is usually disposed between the device housing and the module back panel. In this solution, an inner cavity is formed between the middle frame, the front frame and the planar back housing, and a circuit board is arranged in the inner cavity, which solves the problem that the circuit board cannot be placed resulting from the integration of the back panel and the outer housing. In a third aspect, in an implementation, the display device and the wall-hung member 104 are disposed separately. If the wall-hung member fails, the wall-hung member can be replaced separately without the need to repair the display device as a whole. In a fourth aspect, in an implementation, the display device is attached to the wall (or other mounting positions) by means of cooperation between the wall-hung member and the wall-hung support member. As a result, the distance between the display device and the wall (or other mounting positions) is reduced to make the back of the display device flatter and simpler, and the sides thereof more aesthetic. In a fifth is aspect, in an implementation, the front frame and the middle frame are fitted together in a pull-out manner, which is simple in process and low in cost. In a sixth aspect, in an implementation, the SOC and the T-CON are integrated, so that the circuit board can occupy less internal space of the device, and the size of the device is further reduced. In a seventh aspect, the display device may adopt a direct-type backlight structure. A direct-type ground side light mixing triangular region is used as an inner cavity, which can reduce the overall thickness of the direct-type backlight structure to make the back of the display device flatter and simpler.

A person having an ordinary skill in the art should understand that the discussion of any of the foregoing embodiments is exemplary, and is not intended to imply that the scope of the present disclosure (including the claims) is limited to these examples. With the concept of the present disclosure, the foregoing embodiments or the technical features in different embodiments may also be combined, and the steps may be implemented in any order. Moreover, there are many other changes in different aspects of the present disclosure as described above, which are not provided in detail for the sake of brevity.

The embodiments of the present disclosure are intended to encompass all such substitutions, modifications and variations that fall within the broad scope of the appended claims. Therefore, any omissions, modifications, equivalent substitutions, improvements, etc. made within the spirit and principle of the present disclosure should be included in the protection scope of the present disclosure.

The invention claimed is:

1. A display device comprising:
  a frame comprising: a frame body, a first protrusion disposed on the frame body, and a second protrusion disposed on the frame body, the second protrusion comprising at least one stepped portion;
  a display panel located on a side of one stepped portion of the at least one stepped portion close to a light emitting surface of the display device and located on an inner side of the frame body; and
  a planar back housing fixed on the inner side of the frame body and a side of the first protrusion away from the light emitting surface,
  wherein the frame body comprises a front frame that surrounds an edge of the display panel; and a middle frame that is disposed within a space formed by the display panel, the front frame and the planar back housing, the middle frame, the front frame and the planar back housing forming an inner cavity in which a circuit board is disposed,
  wherein the middle frame comprises: a first side middle frame, a second side middle frame, a third side middle frame, and a fourth side middle frame, the first side middle frame and the fourth side middle frame being arranged opposite to each other, and the second side middle frame and the third side middle frame being arranged opposite to each other,
  wherein the front frame comprises: a first side front frame, a second side front frame, a third side front frame, and a fourth side front frame, the first side front frame and the fourth side front frame being arranged opposite to each other, the second side front frame and the third side front frame being arranged opposite to each other, and the first side front frame, the second side front frame, the third side front frame and the fourth side front frame forming a rectangular closed structure around the display panel,
  wherein the fourth side middle frame comprises a side wall plate inclined from an inner side of the planar back housing to an edge of the display panel, and the side wall plate, the fourth side front frame and the planar back housing forming a first inner cavity in which the circuit board is disposed.

2. The display device according to claim 1, further comprising:
  an inner frame disposed between the fourth side middle frame and the fourth side front frame, the inner frame comprising a first inner frame wall and a second inner frame wall that are perpendicular to each other, the first inner frame wall being used to support the display panel, and the second inner frame wall being connected to the fourth side middle frame to limit a position of the optical structure layer of the display device.

3. The display device according to claim 1, further comprising:
  a light bar assembly disposed on a side of the planar back housing facing the display panel and in contact with the planar back housing, the light bar assembly comprising a plurality of light sources; and a reflective sheet disposed on a side of the light bar assembly facing the display panel, comprising: a first reflective portion that is parallel to a surface of the planar back housing facing the display panel; a second reflective portion that forms an angle with respect to the surface of the planar back housing facing the display panel, wherein the first reflective portion is provided with a plurality of openings, and each light source on the light bar assembly penetrates one of the plurality of openings;

wherein the optical structure layer, the second reflective portion of the reflective sheet, and the middle frame are fixedly connected by a fastening element.

4. The display device according to claim 3, wherein the reflective sheet, the fourth side front frame and the planar back housing form the first inner cavity;

the first side middle frame, the planar back housing and the reflective sheet form a second inner cavity;

the second side middle frame, the planar back housing and the reflective sheet form a third inner cavity;

the third side middle frame, the planar back housing and the reflective sheet form a fourth inner cavity;

each of the first side front frame, the second side front frame and the third side front frame comprises an engaging portion, the first side middle frame is provided with a guide rail on a side close to the first side front frame, and the engaging portion of the first side front frame is fixedly connected to the first side middle frame through the guide rail of the first side middle frame; the second side middle frame is provided with a guide rail on a side close to the second side front frame, and the engaging portion of the second side front frame is fixedly connected to the second side middle frame through the guide rail of the second side middle frame; the third side middle frame is provided with a guide rail on a side close to the third side front frame, and the engaging portion of the third side front frame is fixedly connected to the third side middle frame through the guide rail of the third side middle frame.

5. The display device according to claim 4, wherein each of the first side middle frame, the second side middle frame, and the third side middle frame comprises:

a first middle frame wall comprising a guide rail side wall, a position limiting side wall, and a supporting side wall, the guide rail being arranged on the guide rail side wall, the position limiting side wall being used to limit a position of the optical structure layer and the display panel of the display device, and the supporting side wall being used to support the display panel;

a second middle frame wall that is configured to support the optical structure layer of the display device;

a third middle frame wall that is parallel to the surface of the planar back housing facing the display panel, at least a portion of the third middle frame wall being in contact with the planar back housing.

6. The display device according to claim 1, wherein the circuit board comprises a display driving circuit board, the display device further comprising:

a first circuit board fixing member, the display driving circuit board being fixed on a side of the side wall plate of the fourth side middle frame close to the first inner cavity by the first circuit board fixing member, wherein the first circuit board fixing member comprises a first mounting portion and a first engaging portion, the first mounting portion is fixed on the side of the side wall plate of the fourth side middle frame close to the first inner cavity, and the first engaging portion is used to fix the display driving circuit board.

7. The display device according to claim 1, wherein the circuit board comprises a main board, the main board comprising a system-on-chip and a timing controller which are integrated, the display device further comprising:

a second circuit board fixing member, the main board being fixed on a side of the planar back housing close to the display panel by the second circuit board fixing member, wherein the second circuit board fixing member comprises a second mounting portion and a second engaging portion, the second mounting portion is fixed on the side of the planar back housing close to the display panel, and the second engaging portion is used to fix the main board.

8. The display device according to claim 1, further comprising:

a functional component, the functional component comprising one or more of: a voice component, a network component, a Bluetooth component, and an infrared photosensitive component, the functional component being disposed in the first inner cavity.

9. The display device according to claim 1, wherein the frame body comprises a first side frame body, a second side frame body, a third side frame body, and a fourth side frame body, the display device further comprising:

a pair of base mounting brackets fixed at left and right ends of the fourth side frame body respectively, the pair of base mounting brackets having mounting sockets with openings facing the ground.

10. The display device according to claim 1, further comprising:

a wall-hung support member embedded in an inner surface of an edge of the planar back housing, the wall-hung support member being provided with a mounting groove for fixed connection to a hook-shaped wall-hung member, the wall-hung member being used for hanging and fixing the display device.

11. The display device according to claim 10, wherein the wall-hung member comprises a main body portion, a bearing portion and a position limiting portion, the bearing portion bearing the display device at its lower side, the position limiting portion protruding in a direction perpendicular to the main body portion to limit a relative movement between the wall-hung member and the display device.

12. The display device according to claim 1, further comprising:

a wall-hung plate configured to be fixedly connected to a wall, the wall-hung plate being provided with a plurality of hanging holes; and a plurality of hangers located on a side of the planar back housing away from the light emitting surface, the plurality of hangers being hung in the plurality of hanging holes at corresponding positions of the wall-hung plate.

13. The display device according to claim 12, wherein the hanger is a bolt;

the hanging hole comprises a first portion and a second portion associated with each other, the first portion having an aperture larger than a nut diameter of the bolt, the second portion being closer to a side of the display device facing the ground than the first portion, the second portion having an aperture larger than a screw diameter of the bolt and smaller than the nut diameter of the bolt.

14. The display device according to claim 1, wherein the frame comprises a metal frame, and the planar back housing comprises a tempered glass back panel.

15. The display device according to claim 1, wherein the second protrusion comprises a first stepped portion and a second stepped portion, the first stepped portion is provided with a first engaging slot on a side close to the light emitting surface, and the second stepped portion is provided with a second engaging slot on the side close to the light emitting surface;
the display device further comprises:
a positioning elastic sheet, the positioning elastic sheet comprising a first engaging plate portion, a second engaging plate portion, and a connecting plate portion, the first engaging plate portion being engaged with the first engaging slot, the second engaging plate portion being engaged with the second engaging slot, and the second engaging plate portion having at least one strip-shaped socket extending parallel to the light emitting surface;
an optical structure layer, an edge of which is provided with convex lugs that are asymmetrically distributed, each of which is inserted into the corresponding strip-shaped socket.

16. The display device according to claim 1, wherein
the first engaging plate portion is provided with a first hook on a side away from the connecting plate portion;
the second engaging plate portion is provided with a second hook on a side away from the connecting plate portion;
the first engaging slot is provided with a first hook groove that is cooperated with the first hook;
the second engaging slot is provided with a second hook groove that is cooperated with the second hook.

17. The display device according to claim 1, wherein the circuit board comprises a display driving circuit board and a main board, the main board comprising a system-on-chip and a timing controller which are integrated, and the display driving circuit board and the main board being at least partially overlapped in a direction perpendicular to the light emitting surface.

18. The display device according to claim 2, wherein the inner frame is a plastic cement inner frame.

19. The display device according to claim 4, wherein the fourth side front frame and the fourth side middle frame are connected by screws, and the fourth side front frame and the first, second and third side front frames are detachably connected.

20. The display device according to claim 1, further comprising:
an external host, which is integrated with a main board, at least one operation button and at least one interface.

* * * * *